US012615829B2

(12) United States Patent
Shin

(10) Patent No.: US 12,615,829 B2
(45) Date of Patent: Apr. 28, 2026

(54) SEMICONDUCTOR DEVICE WITH FIELD PLATE STRUCTURES

(71) Applicant: SK keyfoundry Inc., Cheongju-si (KR)

(72) Inventor: Hyunkwang Shin, Cheongju-si (KR)

(73) Assignee: SK keyfoundry Inc., Cheongju-si (KR)

( * ) Notice: Subject to any disclaimer, the term of this patent is extended or adjusted under 35 U.S.C. 154(b) by 425 days.

(21) Appl. No.: 18/448,305

(22) Filed: Aug. 11, 2023

(65) Prior Publication Data

US 2024/0234522 A1    Jul. 11, 2024

(30) Foreign Application Priority Data

Jan. 11, 2023    (KR) ......................... 10-2023-0003862

(51) Int. Cl.
H10D 64/00        (2025.01)
H10D 30/01        (2025.01)
H10D 30/65        (2025.01)
(52) U.S. Cl.
CPC ....... H10D 64/112 (2025.01); H10D 30/0281 (2025.01); H10D 30/65 (2025.01)
(58) Field of Classification Search
CPC .. H10D 64/112; H10D 64/111; H10D 64/115; H10D 30/0281; H10D 30/65; H10D 30/603; H10D 30/0221; H10D 62/393; H10D 64/251
See application file for complete search history.

(56) References Cited

U.S. PATENT DOCUMENTS

| | | | | |
|---|---|---|---|---|
| 7,719,076 B2 * | 5/2010 | Shu | ...................... | H10D 64/112 257/E29.325 |
| 8,704,300 B1 * | 4/2014 | Lin | ...................... | H10D 62/051 257/341 |
| 8,957,475 B2 * | 2/2015 | Moon | .................. | H10D 84/153 257/E29.066 |
| 8,981,477 B2 * | 3/2015 | Moon | ................ | H10D 30/0281 257/E29.066 |

(Continued)

FOREIGN PATENT DOCUMENTS

| | | |
|---|---|---|
| KR | 10-2010-0037005 A | 4/2010 |
| KR | 10-2013-0085751 A | 7/2013 |

OTHER PUBLICATIONS

Korean Office Action issued on Apr. 2, 2024, in counterpart Korean Patent Application No. 10-2023-0003862 (5 pages in English, 5 pages in Korean).

*Primary Examiner* — Maliheh Malek
(74) *Attorney, Agent, or Firm* — NSIP Law

(57)        ABSTRACT
A semiconductor device includes a source region and a drain region formed on a substrate; a gate structure formed between the source region and the drain region; a field insulating layer formed between the gate structure and the drain region; a first field plate structure formed on the field insulating layer, formed on a same plane and material as the gate structure; a source metal wiring connected to the source region, the first field plate structure, and the second field plate structure; a drain metal wiring connected to the drain region; and an interlayer insulating layer formed under the source metal wiring and the drain metal wiring; and a second field plate structure formed on the interlayer insulating layer, formed between the first field plate structure and the drain region, and formed of a material different from a material of the first field plate structure.

14 Claims, 20 Drawing Sheets

(56) References Cited

U.S. PATENT DOCUMENTS

| | | | | |
|---|---|---|---|---|
| 9,171,916 B1 * | 10/2015 | Snyder | H10D 64/111 |
| 9,306,014 B1 * | 4/2016 | Kudymov | H10D 30/475 |
| 9,306,034 B2 * | 4/2016 | Tu | H10D 30/64 |
| 9,373,619 B2 * | 6/2016 | Su | H01L 23/535 |
| 9,543,402 B1 * | 1/2017 | Kudymov | H10D 62/85 |
| 9,722,063 B1 * | 8/2017 | Kudymov | H01L 21/32136 |
| 9,806,189 B2 * | 10/2017 | Kumano | H10D 30/65 |
| 10,121,885 B2 * | 11/2018 | Kudymov | H01L 21/0217 |
| 10,262,938 B2 * | 4/2019 | Wu | H10D 8/411 |
| 10,263,085 B2 * | 4/2019 | Tomomatsu | H01L 23/4824 |
| 10,756,208 B2 * | 8/2020 | Lu | H10D 30/65 |
| 10,930,745 B1 * | 2/2021 | Lin | H10D 62/8503 |
| 11,043,563 B2 * | 6/2021 | Lin | H10D 30/475 |
| 11,127,847 B2 * | 9/2021 | Lee | H01L 21/0254 |
| 11,469,320 B2 * | 10/2022 | Kim | H10D 30/603 |
| 11,552,190 B2 * | 1/2023 | Coyne | H10D 64/112 |
| 11,600,708 B2 * | 3/2023 | Liao | H10D 30/4755 |
| 11,664,430 B2 * | 5/2023 | Lin | H10D 30/4755 |
| | | | 257/76 |
| 11,916,116 B2 * | 2/2024 | Aoki | H10D 64/112 |
| 12,027,614 B2 * | 7/2024 | Kobayashi | H10D 30/475 |
| 12,230,710 B2 * | 2/2025 | Wada | H10D 62/393 |
| 12,244,302 B2 * | 3/2025 | Kanda | H03K 17/302 |
| 12,278,282 B2 * | 4/2025 | Lin | H10D 30/475 |
| 12,310,047 B1 * | 5/2025 | Zhang | H10D 62/115 |
| 12,328,924 B2 * | 6/2025 | Isobe | H10D 64/01 |
| 12,414,323 B1 * | 9/2025 | Zhang | H10D 64/112 |
| 2001/0012671 A1 * | 8/2001 | Hoshino | H10D 30/0221 |
| | | | 438/303 |
| 2004/0201078 A1 * | 10/2004 | Ren | H10D 30/65 |
| | | | 257/500 |
| 2006/0175658 A1 * | 8/2006 | Lee | H10D 64/251 |
| | | | 257/E29.054 |
| 2006/0175670 A1 | 8/2006 | Tsubaki | |
| 2010/0148258 A1 | 6/2010 | Cho | |
| 2012/0187485 A1 * | 7/2012 | Morioka | H10D 30/637 |
| | | | 257/E29.256 |
| 2012/0217581 A1 * | 8/2012 | Kondou | H10D 30/65 |
| | | | 257/E29.256 |
| 2013/0032862 A1 * | 2/2013 | Su | H10D 1/47 |
| | | | 257/272 |
| 2013/0134512 A1 * | 5/2013 | Cheng | H10D 64/111 |
| | | | 257/E29.256 |
| 2013/0161692 A1 * | 6/2013 | Koudymov | H10D 30/4755 |
| | | | 257/288 |
| 2013/0341714 A1 * | 12/2013 | Jang | H10D 64/111 |
| | | | 257/335 |
| 2014/0065781 A1 * | 3/2014 | Chen | H10D 62/157 |
| | | | 438/286 |
| 2014/0147980 A1 | 5/2014 | Wu et al. | |
| 2014/0231911 A1 | 8/2014 | Kim et al. | |
| 2014/0312417 A1 * | 10/2014 | Strasser | H10D 64/516 |
| | | | 438/286 |
| 2015/0262990 A1 * | 9/2015 | Kanda | H10D 64/112 |
| | | | 257/337 |
| 2016/0260704 A1 * | 9/2016 | Huo | H01L 21/76202 |
| 2016/0336410 A1 * | 11/2016 | Hsiao | H01L 23/485 |
| 2016/0351708 A1 * | 12/2016 | Kameoka | H10D 62/393 |
| 2017/0104097 A1 * | 4/2017 | Park | H10D 30/603 |
| 2017/0194488 A1 * | 7/2017 | Gao | H10D 64/112 |
| 2017/0294532 A1 * | 10/2017 | Kudymov | H10D 30/015 |
| 2018/0190815 A1 * | 7/2018 | Zhang | H10D 84/038 |
| 2019/0259751 A1 * | 8/2019 | Pala | H10D 84/038 |
| 2019/0280092 A1 * | 9/2019 | Lin | H10D 30/4755 |
| 2020/0091331 A1 * | 3/2020 | Hung | H10D 30/475 |
| 2020/0091340 A1 | 3/2020 | Snyder | |
| 2020/0295171 A1 * | 9/2020 | Hung | H10D 64/112 |
| 2020/0350399 A1 * | 11/2020 | Wong | H10D 62/343 |
| 2020/0365718 A1 * | 11/2020 | Lee | H01L 21/0254 |
| 2020/0395452 A1 * | 12/2020 | Wang | H10D 30/452 |
| 2021/0043724 A1 * | 2/2021 | Wu | H10D 30/475 |
| 2021/0175336 A1 * | 6/2021 | Lu | H10D 30/65 |
| 2021/0184033 A1 * | 6/2021 | Coyne | H10D 62/116 |
| 2021/0257466 A1 * | 8/2021 | Lin | H10D 62/824 |
| 2021/0296451 A1 * | 9/2021 | Chen | H10D 30/0285 |
| 2022/0013520 A1 * | 1/2022 | Ho | H10D 62/126 |
| 2022/0020863 A1 * | 1/2022 | Han | H01L 21/0415 |
| 2022/0052197 A1 * | 2/2022 | Wada | H10D 30/65 |
| 2022/0059662 A1 * | 2/2022 | Chung | H10D 62/111 |
| 2022/0123142 A1 * | 4/2022 | Yanagi | H10D 62/126 |
| 2022/0140140 A1 * | 5/2022 | Li | H10D 30/0221 |
| | | | 257/288 |
| 2022/0254876 A1 * | 8/2022 | Lian | H10D 64/112 |
| 2022/0254888 A1 * | 8/2022 | Wang | H10D 64/112 |
| 2022/0293745 A1 * | 9/2022 | Isobe | H10D 30/475 |
| 2022/0367712 A1 * | 11/2022 | Qiao | H10D 62/157 |
| 2023/0155025 A1 * | 5/2023 | Wada | H10D 62/60 |
| | | | 257/335 |
| 2023/0163177 A1 | 5/2023 | Jin et al. | |
| 2024/0097021 A1 * | 3/2024 | Motai | H10D 30/0297 |
| 2024/0162345 A1 * | 5/2024 | Pandey | H01L 21/76224 |
| 2024/0304702 A1 * | 9/2024 | Bothe | H10D 30/472 |
| 2024/0321973 A1 * | 9/2024 | Yang | H10D 30/0281 |
| 2025/0301748 A1 * | 9/2025 | Lee | H10D 30/0221 |
| 2025/0344460 A1 * | 11/2025 | Lian | H10D 64/112 |

* cited by examiner

SEMICONDUCTOR DEVICE WITH FIELD PLATE STRUCTURES

CROSS REFERENCE TO RELATED APPLICATION

The application claims the benefit under 35 USC § 119(a) of Korean Patent Application No. 10-2023-0003862, filed on Jan. 11, 2023, in the Korean Intellectual Property Office, the entire disclosure of which is incorporated herein by reference for all purposes.

BACKGROUND

1. Field

The following description relates to a semiconductor device and method of manufacturing the same.

2. Description of Related Art

A lateral double-diffused metal oxide semiconductor (LD-MOS) transistor is a high-voltage power device widely used in various power devices, including display driver ICs, power converters, motor controllers, and power source devices for vehicles.

A low specific on-resistance and a high breakdown voltage are desired for high-performance LDMOS transistors; however, it is difficult to manufacture high-performance LDMOS transistors.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor device includes a source region and a drain region formed to be spaced apart from each other on a substrate; a gate structure formed between the source region and the drain region on the substrate; a field insulating layer formed between the gate structure and the drain region; a first field plate structure formed on the field insulating layer, formed on a same plane as the gate structure, and formed of a same material as the gate structure; a source metal wiring connected to the source region, the first field plate structure, and the second field plate structure; a drain metal wiring connected to the drain region; and an interlayer insulating layer formed under the source metal wiring and the drain metal wiring; and a second field plate structure formed on the interlayer insulating layer, formed between the first field plate structure and the drain region, and formed of a material different from a material of the first field plate structure.

The semiconductor device may further include a source silicide formed on the source region; a gate silicide formed on the gate structure; a first field plate silicide formed on the first field plate structure; and a drain silicide formed on the drain region.

The semiconductor device may further include a source contact plug connected to the source region; a first field plate contact plug connected to the first field plate structure; a second field plate contact plug connected to the second field plate structure; and a drain contact plug connected to the drain region. A length of the second field plate contact plug may be smaller than a length of the first field plate contact plug.

The source metal wiring may be connected to the source contact plug, the first field plate contact plug, and the second field plate contact plug. The drain metal wiring may be connected to the drain contact plug.

The semiconductor device may further include a second source metal wiring connected to the source metal wiring. A longitudinal length of the second source metal wiring may be longer than a longitudinal length of the source metal wiring.

The interlayer insulating layer may include a first interlayer insulating layer formed to cover the field insulating layer, the gate structure, and the first field plate structure; and a second interlayer insulating layer formed to cover the second field plate structure and the first interlayer insulating layer.

The semiconductor device may further include a body region having a first conductivity type, formed on the substrate to surround the source region, and spaced apart from the field insulating layer; and a drift region having a second conductivity type and formed to surround the drain region and the field insulating layer. The field insulating layer may be disposed between the first field plate structure and the drift region. The field insulating layer and the first interlayer insulating layer may be disposed between the second field plate structure and the drift region. The field insulating layer, the first interlayer insulating layer, and the second interlayer insulating layer may be disposed between the source metal wiring and the drift region.

The first field plate structure and the second field plate structure may be formed on different planes. The gate structure and the first field plate structure may include poly-silicon, and the second field plate structure may include a metal nitride film.

In another general aspect, a method of manufacturing a semiconductor, includes forming an active region and a field insulating layer on a substrate; forming a gate structure on the substrate; forming a first field plate structure on the field insulating layer simultaneously with the gate structure, on a same plane as the gate structure, and using a same material as the gate structure; forming a source region near the gate structure, and a drain region near the first field plate structure; forming a second field plate structure on the field insulating layer of a material different from a material of the first field plate structure, and on a plane different from a plane of the first field plate structure; forming source metal wirings connected to the source region, the first field plate structure, and the second field plate structure, respectively; and forming a drain metal wiring connected to the drain region.

The method may further include forming a source contact plug, a drain contact plug, a first field plate contact plug, and a second field plate contact plug connected to the source region, the drain region, the first field plate structure, and the second field plate structure, respectively. A vertical length of the second field plate contact plug may be smaller than a vertical length of the first field plate contact plug.

The method may further include forming a source metal wiring connected to at least one among the source contact plug, the first field plate contact plug, and the second field plate contact plug; and forming a drain metal wiring connected to the drain contact plug.

The method may further include forming a body region having a first conductivity type and a drift region having a second conductivity type on the substrate.

The first field plate structure and the second field plate structure may be formed on different planes. The gate structure and the first field plate structure may include poly-silicon.

The second field plate structure may include a metal nitride film.

In another general aspect, a semiconductor device includes a first drift region disposed on a semiconductor layer of a first conductivity type and a first deep well region of a second conductivity type; a field insulating layer disposed on the first drift region; a body region disposed adjacent of the first drift region and spaced apart from the field insulating layer; a source region disposed in the body region; a drain region disposed above the first deep well region in the first drift region; a gate structure disposed on portions of the field insulating layer, the first drift region, the body region, and the source region; a first field plate structure disposed on the field insulating layer, on a same plane as the gate structure, and formed of a same material as a material of the gate structure; a second field plate structure disposed on the interlayer insulating layer between the first field plate structure and the drain region, and formed of a material different from a material of the first field plate structure; a source metal wiring connected to the source region, the first field plate structure, and the second field plate structure; and a drain metal wiring connected to the drain region.

The semiconductor device may further include a pickup region disposed adjacent the source region; a source silicide disposed on the pickup region and the source region; a gate silicide disposed on the gate structure; a first field plate silicide disposed on the first field plate structure; and a drain silicide disposed on the drain region.

The semiconductor device may further include a source contact plug connected to the source region and the source metal wiring; a first field plate contact plug connected to the first field plate structure and the source metal wiring; and a second field plate contact plug connected to the second field plate structure and the source metal wiring. A length of the second field plate contact plug may be smaller than a length of the first field plate contact plug.

The semiconductor device may further include a second source metal wiring connected to the source metal wiring. A longitudinal length of the second source metal wiring may be formed longer than a longitudinal length of the source metal wiring.

The interlayer insulating layer may include a first interlayer insulating layer disposed on the field insulating layer, the gate structure, and the first field plate structure; and a second interlayer insulating layer disposed on the second field plate structure and the first interlayer insulating layer.

The first field plate structure and the second field plate structure may be disposed on different planes. The gate structure and the first field plate structure may include poly-silicon, and the second field plate structure may include a metal nitride film.

Other features and aspects will be apparent from the following detailed description, the drawings, and the claims.

BRIEF DESCRIPTION OF DRAWINGS

FIG. 1 is a cross-sectional view illustrating a semiconductor device according to an embodiment of the present disclosure.

FIG. 2 is a cross-sectional view illustrating a semiconductor device according to another embodiment of the present disclosure.

FIG. 3 is a cross-sectional view illustrating a semiconductor device according to still another embodiment of the present disclosure.

FIG. 4 is a cross-sectional view illustrating a semiconductor device according to further still another embodiment of the present disclosure.

Figure 5:
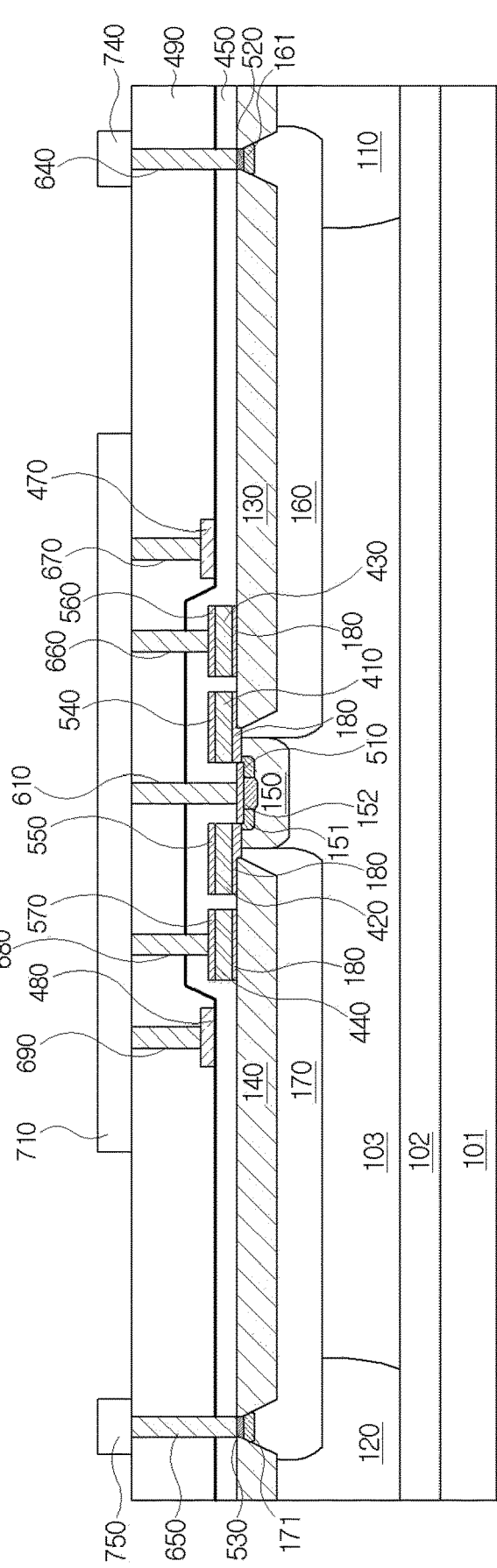
FIG. 5 is a cross-sectional view illustrating the structure of two adjacent semiconductor devices according to an embodiment of the present disclosure.

Throughout the drawings and the detailed description, unless otherwise described or provided, the same drawing reference numerals may be understood to refer to the same or like elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences within and/or of operations described herein are merely examples, and are not limited to those set forth herein, but may be changed as will be apparent after an understanding of the disclosure of this application, except for sequences within and/or of operations necessarily occurring in a certain order. As another example, the sequences of and/or within operations may be performed in parallel, except for at least a portion of sequences of and/or within operations necessarily occurring in an order, e.g., a certain order. Also, descriptions of features that are known after an understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application. The use of the term "may" herein with respect to an example or embodiment, e.g., as to what an example or embodiment may include or implement, means that at least one example or embodiment exists where such a feature is included or implemented, while all examples are not limited thereto.

Throughout the specification, when a component or element is described as being "on", "connected to," "coupled to," or "joined to" another component, element, or layer it may be directly (e.g., in contact with the other component or element) "on", "connected to," "coupled to," or "joined to" the other component, element, or layer or there may reasonably be one or more other components, elements, layers intervening therebetween. When a component or element is described as being "directly on", "directly connected to," "directly coupled to," or "directly joined" to another component or element, there can be no other elements intervening therebetween. Likewise, expressions, for example, "between" and "immediately between" and "adjacent to" and "immediately adjacent to" may also be construed as described in the foregoing.

Although terms such as "first," "second," and "third", or A, B, (a), (b), and the like may be used herein to describe various members, components, regions, layers, or sections, these members, components, regions, layers, or sections are not to be limited by these terms. Each of these terminologies is not used to define an essence, order, or sequence of corresponding members, components, regions, layers, or sections, for example, but used merely to distinguish the corresponding members, components, regions, layers, or sections from other members, components, regions, layers, or sections. Thus, a first member, component, region, layer, or section referred to in the examples described herein may also be referred to as a second member, component, region, layer, or section without departing from the teachings of the examples.

The terminology used herein is for describing various examples only and is not to be used to limit the disclosure. The articles "a," "an," and "the" are intended to include the plural forms as well, unless the context clearly indicates otherwise. As non-limiting examples, terms "comprise" or "comprises," "include" or "includes," and "have" or "has" specify the presence of stated features, numbers, operations, members, elements, and/or combinations thereof, but do not preclude the presence or addition of one or more other features, numbers, operations, members, elements, and/or combinations thereof, or the alternate presence of an alternative stated features, numbers, operations, members, elements, and/or combinations thereof. Additionally, while one embodiment may set forth such terms "comprise" or "comprises," "include" or "includes," and "have" or "has" specify the presence of stated features, numbers, operations, members, elements, and/or combinations thereof, other embodiments may exist where one or more of the stated features, numbers, operations, members, elements, and/or combinations thereof are not present.

Due to manufacturing techniques and/or tolerances, variations of the shapes shown in the drawings may occur. Thus, the examples described herein are not limited to the specific shapes shown in the drawings, but include changes in shape that occur during manufacturing.

Unless otherwise defined, all terms, including technical and scientific terms, used herein have the same meaning as commonly understood by one of ordinary skill in the art to which this disclosure pertains specifically in the context on an understanding of the disclosure of the present application. Terms, such as those defined in commonly used dictionaries, are to be interpreted as having a meaning that is consistent with their meaning in the context of the relevant art and specifically in the context of the disclosure of the present application, and are not to be interpreted in an idealized or overly formal sense unless expressly so defined herein.

The terms used in this specification are terms defined in consideration of functions in a bootstrap diode, semiconductor device, and manufacturing method of a semiconductor device proposed in this specification, and the definition of each term described in this specification takes precedence over other definitions. Terms whose definitions are not described in this specification are known terms and may be defined as understood and recognized by those skilled in the art.

A semiconductor device used throughout the present disclosure may refer to a high-voltage integrated circuit or a chip configured using semiconductors and capable of performing a specific function.

Various embodiments of this present disclosure relate to a semiconductor device and a method of manufacturing the same, and more specifically, to a semiconductor device having a plurality of field plate structures and a plurality of metal wirings in a cascade structure, and a method of manufacturing the same.

Figure 1:
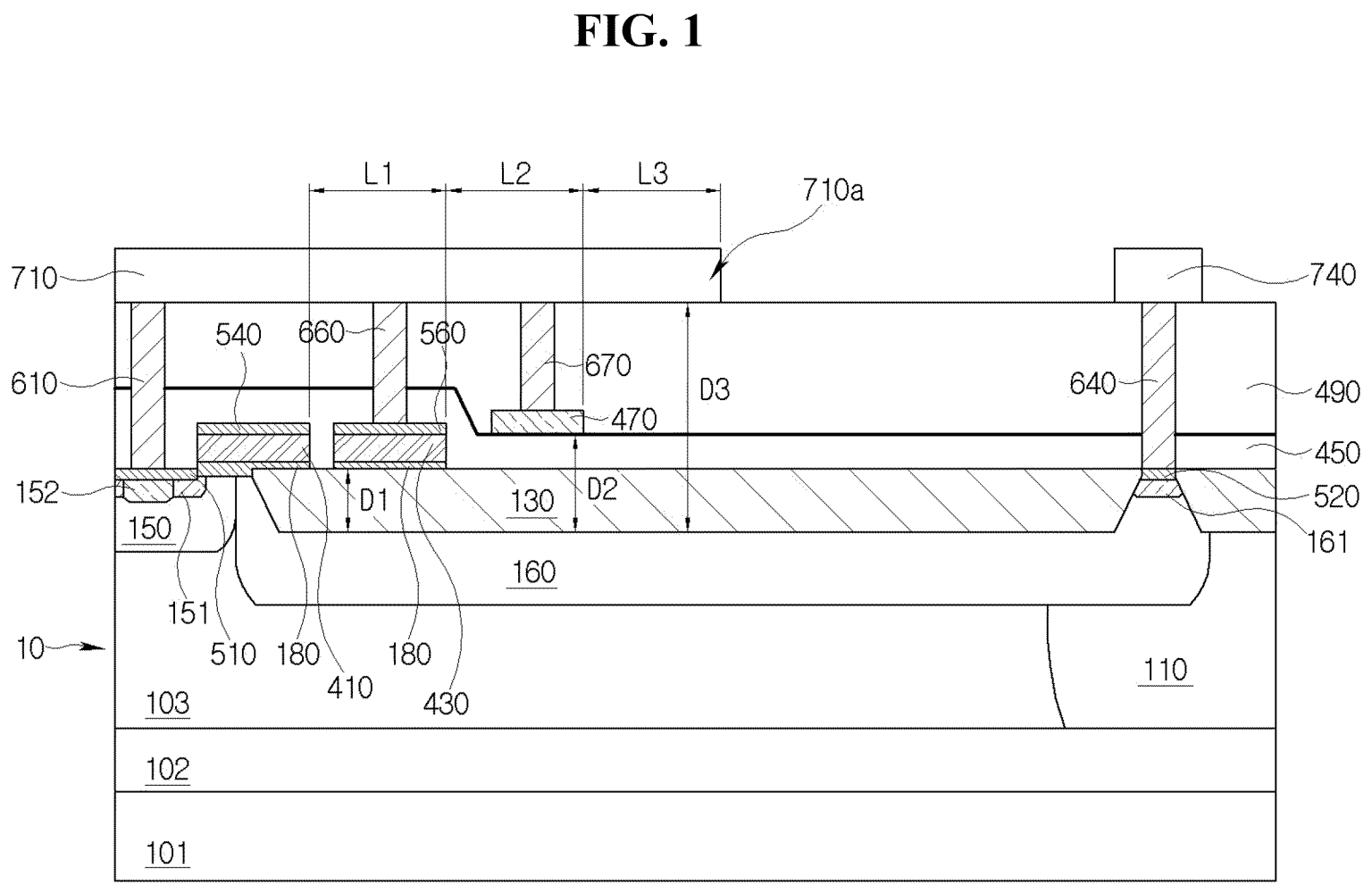

FIG. 1 is a cross-sectional view illustrating a semiconductor device according to an embodiment of the present disclosure.

Referring to FIG. 1, the semiconductor device may include a first semiconductor layer 101 on a substrate 10, a second semiconductor layer 102 on the first semiconductor layer 101, a third semiconductor layer 103 on the second semiconductor layer 102, a first deep well region 110, a field insulating layer 130, a body region 150, a first drift region 160, a source region 151, a pickup region 152, a first drain region 161, a gate insulating layer 180, a first gate structure 410, a first field plate structure 430, a first interlayer insulating layer 450, a second field plate structure 470, a second interlayer insulating layer 490, a source silicide 510, a first gate silicide 540, a first field plate silicide 560, a first drain silicide 520, a source contact plug 610, a gate contact plug, a first field plate contact plug 660, a second field plate contact plug 670, a first drain contact plug 640, a first source metal wiring 710 and a first drain metal wiring 740.

Here, a region excluding the field insulating layer 130 may be an active region. The first gate structure 410 may be formed on the active region and the field insulating layer 130. Thus, the first gate structure 410 may be formed to overlap the active region and the field insulating layer 130.

The first field plate structure 430 may be formed on the field insulating layer 130 in a way that the first field plate structure 430 overlaps with the field insulating layer 130. Similarly, the second field plate structure 470 may also be formed on the field insulating layer 130 in a way that the second field plate structure 470 overlaps with the field insulating layer 130.

In addition, the first gate structure 410 and the first field plate structure 430 are formed side by side on the same plane and may be simultaneously formed using the same material. However, the second field plate structure 470 may be formed on a different plane, made of a different material, and formed in a different step from the first gate structure 410 or the first field plate structure 430. For peak electric field relaxation, the first field plate structure 430 and the second field plate structure 470 may be electrically connected to the first source metal wiring 710 and used.

Here, the first interlayer insulating layer 450 and the second interlayer insulating layer 490 may be referred to as the interlayer insulating layers 450 and 490. The first interlayer insulating layer 450 and the second interlayer insulating layer 490 may comprise an oxide-based thin film. Alternatively, another insulating layer such as SiN, SiON, SiOC, SiOCN, or low-k insulating layer may be added between the first interlayer insulating layer 450 and the second interlayer insulating layer 490 as needed. In addition, an etch stop layer (not illustrated) may be formed between the first interlayer insulating layer 450 and the substrate 10 to facilitate the formation of the contact plugs 610, 640, 660, and 670.

The first semiconductor layer 101 may be formed on the substrate 10 and have a first conductivity type. Here, the first conductivity type may be a P-type conductivity type. For example, the first semiconductor layer 101 may be a layer doped with P-type impurities.

The second semiconductor layer 102 may be formed on the first semiconductor layer 101 and may have a second conductivity type. Here, the second conductivity type may be an N-type conductivity type. Accordingly, the second semiconductor layer 102 may be referred to as an N+ Buried Layer (NBL). The second semiconductor layer 102 is formed to make a high voltage device into a fully isolated MOS device, which aims to reduce noise caused by switching of the high voltage device.

The third semiconductor layer 103 may be formed on the second semiconductor layer 102 and have the first conductivity type. The third semiconductor layer 103 may also be referred to as an epi-layer.

The first deep well region 110 of the second conductivity type may be positioned below the first drain region 161 to be described later and may be formed in contact with the lower surface of the first drift region 160. The first deep well region 110 may also be referred to as a High Voltage N Well (HVNW). The first deep well region 110 may be formed by implanting N-type impurities into the third semiconductor layer 103. Also, the first deep well region 110 may be formed having a border with the second semiconductor layer 102 while ion-implanted N-type impurities are diffused.

On the third semiconductor layer 103, the field insulating layer 130 may be formed between the first drain region 161 and the source region 151. The field insulating layer 130 may be provided in a shallow trench, deep trench, or LOCOS (local oxidation of silicon) form to insulate adjacent devices. In addition, the field insulating layer 130 may include an oxide layer or a nitride layer.

After forming the field insulating layer 130, the first drift region 160 may be formed by implanting N-type impurities into the third semiconductor layer 103 and the body region 150 may be formed by implanting P-type impurities into the third semiconductor layer 103. Alternatively, the field insulating layer 130 may be formed after first forming the first drift region 160 and the body region 150 on the third semiconductor layer 103.

The first drift region 160 may be adjacent to one side surface of the body region 150, and be formed on the third semiconductor layer 103 to surround the field insulating layer 130.

The first drift region 160 may be formed to partially overlap with the first gate structure 410 in a vertical direction. The first drift region 160 may have the second conductivity type. The first drift region 160 may be formed by implanting N-type impurities into the substrate 10. Alternatively, the first drift region 160 by implanting N-type impurities into the third semiconductor layer 103 and a portion of the first deep well region 110 are formed before the field insulating layer 130 may be formed.

The first drift region 160 may be formed to improve a breakdown voltage of the semiconductor device. According to the principle that the breakdown voltage increases when the doping concentration of the impurities is low in the PN junction, the first drift region 160 may be a region doped at a lower concentration than that of the first drain region 161 in order to raise the breakdown voltage between the source region 151 and the first drain region 161. The first drift region 160 may be doped at a low concentration to improve withstand voltage performance of the semiconductor device.

The body region 150 may be spaced apart from the field insulating layer 130 while surrounding the source region 151 and the pickup region 152. In addition, the body region 150 may be formed between the first drift region 160 and the second drift region 170 to be described later (See FIG. 5), while being in contact with the first drift region 160 and the second drift region 170. The body region 150 may have the first conductivity type, and the first conductivity type may be the P-type conductivity type.

The body region 150 may be formed by implanting P-type impurities into the substrate 10. Alternatively, the body region 150 is formed by implanting P-type impurities into a portion of a region of the third semiconductor layer 103 before the field insulating layer 130 may be formed.

The source region 151 and the pickup region 152 may be formed by implanting ions into the body region 150. A channel may be formed in the body region 150.

The source region 151 having the first conductivity type and the pickup region 152 having the second conductivity type may be formed in the body region 150.

The source region 151 may be formed by doping the body region 150 with N-type impurities, which are the second conductivity type. When a voltage is applied to the first drain region 161 and the first gate structure 410, a channel may be formed in the body region 150 disposed between the source region 151 and the first gate structure 410.

The pickup region 152 may be formed by doping the body region 150 with P-type impurities, which are the first conductivity type. The pickup region 152 may be doped with P-type impurities at a higher concentration than the body region 150. For example, an impact ionization phenomenon may occur at a PN junction between the body region 150 and the first drift region 160, and a kink effect due to a hole current that may be generated by the impact ionization phenomenon, a parasitic bipolar transistor, and the like may occur. The pickup region 152 of the P-type which is of the first conductivity type may be formed in the body region 150 to prevent the occurrence of the kink effect, the parasitic bipolar transistor, and the like by moving the hole current to the pickup region 152.

The first drain region 161 may be formed in the first drift region 160. For example, the first drain region 161 may be a region formed by doping the first drift region 160 with N-type impurities of the second conductivity type.

The first gate structure 410 may be formed on the substrate 10 between the source region 151 and the first drain region 161. The first gate structure 410 may be formed on the body region 150, the first drift region 160, and the field insulating layer 130. The first gate structure 410 may comprise poly-silicon (Poly-Si) or a metal film. Materials such as tungsten nitride (WN), titanium nitride (TiN), Gallium Nitride (GaN), tungsten (W), titanium (Ti), aluminum (Al), and copper (Cu) may be used as the metal film.

The gate insulating layer 180 may be formed between the first gate structure 410 and the body region 150, the first drift region 160, and the field insulating layer 130. The gate insulating layer 180 may comprise any one or a plurality of layers of SiO2, SiN, SiON, or a high-k material.

The first field plate structure 430 may be formed on the substrate 10 between the first gate structure 410 and the first drain region 161. The first field plate structure 430 may be formed on the field insulating layer 130 while overlapping with the field insulating layer 130, and may comprise the same material in the same step as the first gate structure 410 and formed simultaneously with the first gate structure 410. A distance between the first field plate structure 430 and the drift region 160 may be referred to as a first depth D1. The first depth D1 may be considered equal to the thickness of the field insulating layer 130.

A position of forming the first field plate structure 430 may vary depending on the thickness of the field insulating layer 130. The first field plate structure 430 may comprise Poly-Si or a metal film. The gate insulating layer 180 and the field insulating layer 130 may be formed between the first field plate structure 430 and the first drift region 160.

The first field plate structure 430 may be formed between the source region 151 and the first drain region 161 to lower the peak electric field of a channel formed in the first drift region 160. Although the first field plate structure 430 is illustrated in a rectangular shape in FIG. 1, various pattern shapes are possible depending on the purpose.

The first interlayer insulating layer 450 may be deposited on the substrate 10 to cover the first gate structure 410 and the first field plate structure 430. The first interlayer insulating layer 450 may be formed to cover the body region 150, the first drift region 160, the field insulating layer 130, the first gate structure 410, and the first field plate structure 430.

The first interlayer insulating layer 450 may be an inter level dielectric (ILD). The first interlayer insulating layer 450 may comprise a material such as silicon oxide (SiO2) film, undoped silicate glass (USG), tetraethyl orthosilicate (TEOS), boron-phosphors silicate glass (BPSG), or phosphors silicate glass (PSG).

As will be described later, the first interlayer insulating layer 450 may be formed at various heights, and the position at which the second field plate structure 470 is formed may vary according to the height of the first interlayer insulating layer 450 formed in a direction of the first drain region 161.

The second field plate structure 470 may be formed on the first interlayer insulating layer 450 between the first field plate structure 430 and the first drain region 161. As mentioned above, the second field plate structure 470 may also be formed on the field insulating layer 130. The second field plate structure 470 may be formed to overlap with the field insulating layer 130. The field insulating layer 130 and the first interlayer insulating layer 450 may be formed between the second field plate structure 470 and the drift region 160. A distance between the second field plate structure 470 and the drift region 160 may be referred to as a second depth D2.

The first interlayer insulating layer 450 and the field insulating layer 130 may be formed between the second field plate structure 470 and the first drift region 160. The second field plate structure 470 may comprise a metal film or a metal nitride film. Examples of the metal film include titanium (Ti), tungsten (W), tantalum (Ta), aluminum (Al), nickel (Ni), and copper (Cu). Examples of the metal nitride film include titanium nitride (TiN), tungsten nitride (WN), and tantalum nitride (TaN). The second field plate structure 470 may be typically made of titanium nitride (TiN), which is easily etched.

The second field plate structure 470 may be disposed between the source region 151 and the first drain region 161 to relieve the peak electric field formed in the first drift region 160. For example, the peak electric field of the first drift region 160 gradually increases in a direction from the source region 151 to the first drain region 161 and has a high peak electric field near the first drain region 161. The second field plate structure 470 may be positioned closer to the first drain region 161 than the first field plate structure 430, and the second field plate structure 470 may further relieve the high peak electric field of the first drift region 160 positioned below the second field plate structure 470. That is, the first field plate structure 430 and the second field plate structure 470 may make the electric field uniformly distributed without concentration in one place. Although the second field plate structure 470 is illustrated in a rectangular shape in FIG. 1, various pattern shapes are possible depending on the purpose.

In addition, the position of the second field plate structure 470 may depend on the thickness of the first interlayer insulating layer 450. Depending on the thickness of the first interlayer insulating layer 450 and the field insulating layer 130, the high peak electric field around the first drain region 161 may be lowered, and a transistor's breakdown voltage between the first source region 151 and the first drain region 161 may increase.

The second interlayer insulating layer 490 may be formed on the first interlayer insulating layer 450 to surround the second field plate structure 470.

The second interlayer insulating layer 490 may be an inter level dielectric (ILD). The second interlayer insulating layer 490 may comprise silicon oxide (SiO2) film, or a material such as USG, TEOS, BPSG, PSG, or the like.

The source silicide 510 may be formed on the source region 151 and the pickup region 152. The first drain silicide 520 may be formed on the first drain region 161. The first gate silicide 540 may be formed on the first gate structure 410. The first field plate silicide 560 may be formed on the first field plate structure 430. The first field plate silicide 560 may be used to lower a resistance between the first field plate contact plug 660 which will be described later and the first field plate structure 430. Here, the source silicide 510, the first gate silicide 540, the first field plate silicide 560, and the first drain silicide 520 may be simultaneously formed by a salicide process step.

The source contact plug 610 may be connected to the source region 151 and the pickup region 152. As will be described later, the source contact plug 610 may connect the first source metal wiring 710, the source region 151, and the pickup region 152. The first drain contact plug 640 may be connected to the first drain region 161. As will be described later, the first drain contact plug 640 may connect the first drain metal wiring 740 and the first drain region 161.

The first field plate contact plug 660 may be connected to the first field plate structure 430. The first field plate contact plug 660 may connect the first source metal wiring 710 and the first field plate structure 430, as will be described later.

The second field plate contact plug 670 may be connected to the second field plate structure 470. As will be described later, the second field plate contact plug 670 may connect the first source metal wiring 710 and the second field plate structure 470. The vertical length of the second field plate contact plug 670 may be smaller than the length of the source contact plug 610, the first drain contact plug 640, or the first field plate contact plug 660. This is because the second field plate structure 470 is formed at a higher location than the first source region 151, the first drain region 161, and the first field plate structure 430. This affects the resistance of the second field plate contact plug 670 to be lower than the resistances of other contact plugs.

The plurality of contact plugs 610, 640, 660, and 670 described above may comprise a conductive material such as poly-silicon or a metal such as tungsten (W), aluminum (Al), or copper (Cu). Through a photo process and an etching process, contact holes (not illustrated) may be formed in a way to pass through the first interlayer insulating layer 450 and the second interlayer insulating layer 490 and expose upper portions of the source region 151, the pickup region 152, the first gate structure 410, the first field plate structure 430 and the second field plate structure 470, and the first drain region 161, respectively, and the source contact plug 610, the first gate contact plug (not illustrated), the first field plate contact plug 660, the second field plate contact plug 670 and the first drain contact plug 640 may be formed by gap-filling inside the contact holes with a metal material such as tungsten. Here, the source contact plug 610, the first gate contact plug (not illustrated), the first field plate contact plug 660, the second field plate contact plug 670, and the first drain contact plug 640 may be formed simultaneously in a contact plug process step. Accordingly, the process of manufacturing the semiconductor device may be simplified.

The first source metal wiring 710 and the first drain metal wiring 740 may be formed on the second interlayer insulating layer 490. In addition, a gate metal wiring (not illustrated) may be formed on the second interlayer insulating layer 490. The first source metal wiring 710 may be connected to the source contact plug 610, the first field plate contact plug 660, and the second field plate contact plug 670. The first drain metal wiring 740 may be connected to the first drain contact plug 640. The gate metal wiring may be connected to the first gate contact plug.

Here, the first source metal wiring 710 may include a portion 710a that is longer than a side surface of the second field plate structure 470 in the direction of the first drain region 161. The elongated portion 710a may be referred to as an extension region or a protrusion region. The second interlayer insulating layer 490, the first interlayer insulating layer 450, and the field insulating layer 130 positioned below the elongated portion 710a of the first source metal wiring 710 may insulate between the elongated portion 710a of the first source metal wiring 710 and the first drift region 160. Thus, the elongated portion 710a of the first source metal wiring 710 may be referred to as a third field plate structure 710a. The third field plate structure 710a serves the same role as the second field plate structure 470 and may be disposed to lower the high peak electric field formed in the first drift region 160 near the first drain region 161.

The field insulating layer 130, the first interlayer insulating layer 450, and the second interlayer insulating layer 490 may be formed between the third field plate structure 710a and the drift region 160. Also, a distance between the third field plate structure 710a and the drift region 160 may be referred to as a third depth D3.

A distance from a right end of the gate structure 410 to a right end of the first field plate structure 430 may be referred to as a first length L1. A distance from a right end of the first field plate structure 430 to a right end of the second field plate structure 470 may be referred to as a second length L2. A distance between a right end of the second field plate structure 470 and an end of the third field plate structure 710a may be referred to as a third length L3. A length combining the first length L1, the second length L2, and the third length L3 may be referred to as a field plate region for mitigating the electric field. For the electric field relaxation, the first length L1, the second length L2, and the third length L3 may be formed the same as each other, or may be formed to become gradually longer toward the first length L1, the second length L2, and the third length L3.

Distances between the drift region 160 and the first field plate structure 430, between the drift region 160 and the second field plate structure 470, and between the drift region 160 and the third field plate structure 710a, respectively, are the first depth D1, the second depth D2, and the third depth D3. The distances may be gradually further away from the drift region 160 toward the first field plate structure 430, the second field plate structure 470, and the third field plate structure 710a.

The source region 151, the pickup region 152, the first field plate structure 430, and the second field plate structure 470 may be electrically connected to the first source metal wiring 710 through the respective contact plugs 610, 660, and 670. As the first field plate structure 430 and the second field plate structure 470 are electrically connected to the source region 151 and the pickup region 152, the electric field around the first drain region 161 is lowered, and a parasitic capacitance component generated between the first field plate structure 430, the second field plate structure 470 and the first drain region 161 may be removed. Also, the withstand voltage of the semiconductor device may be improved.

Alternatively, as the first field plate structure 430, the second field plate structure 470, and the third field plate structure 710a are electrically connected to the source metal wiring 710, the peak electric field around the first drain region 161 is relieved so that the parasitic capacitance component generated among the first field plate structure 430, the second field plate structure 470, the third field plate structure 710a and the first drain region 161 can be removed. Also, the withstand voltage of the semiconductor device may be improved.

Figure 2:
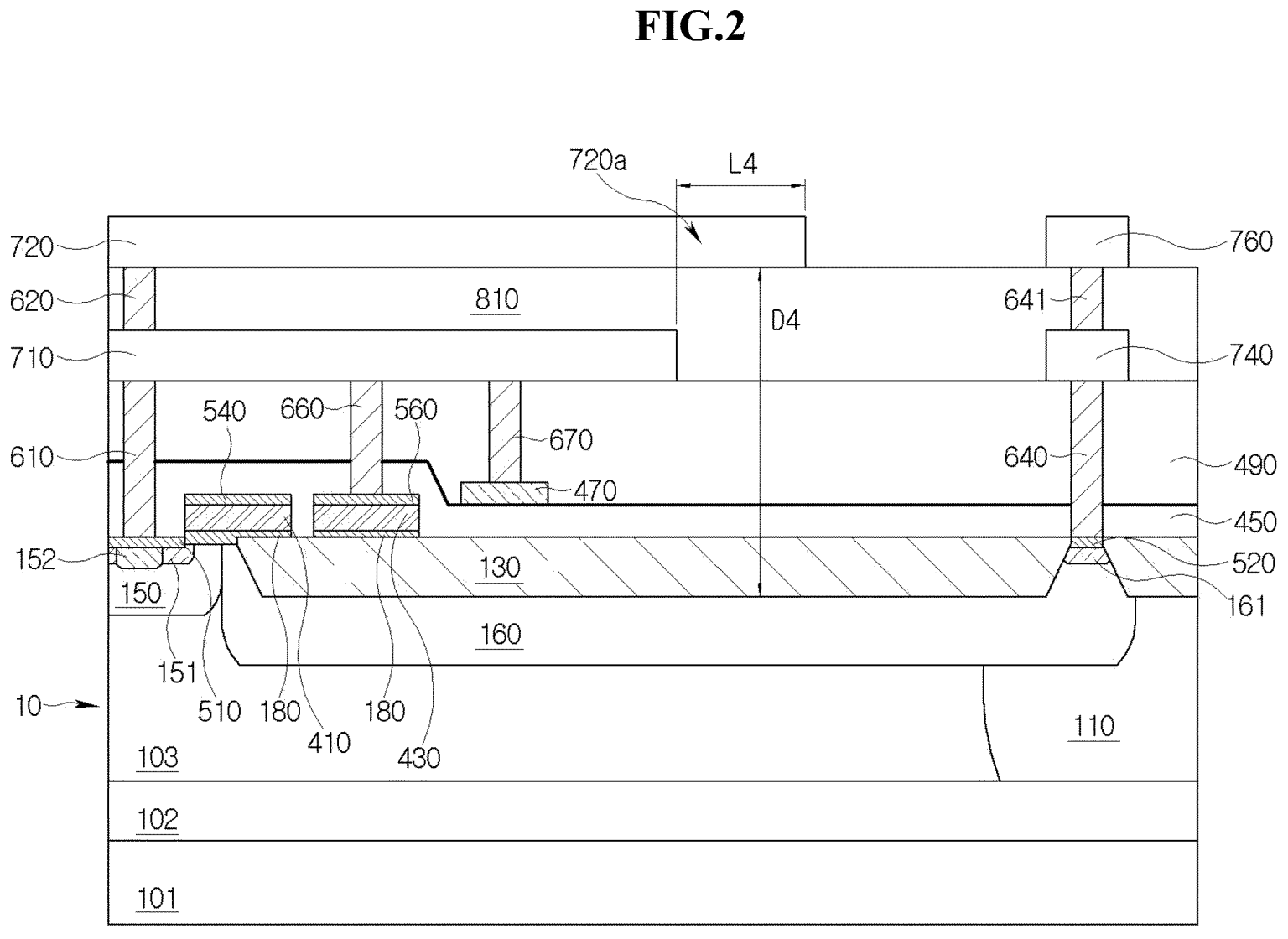
Figure 3:
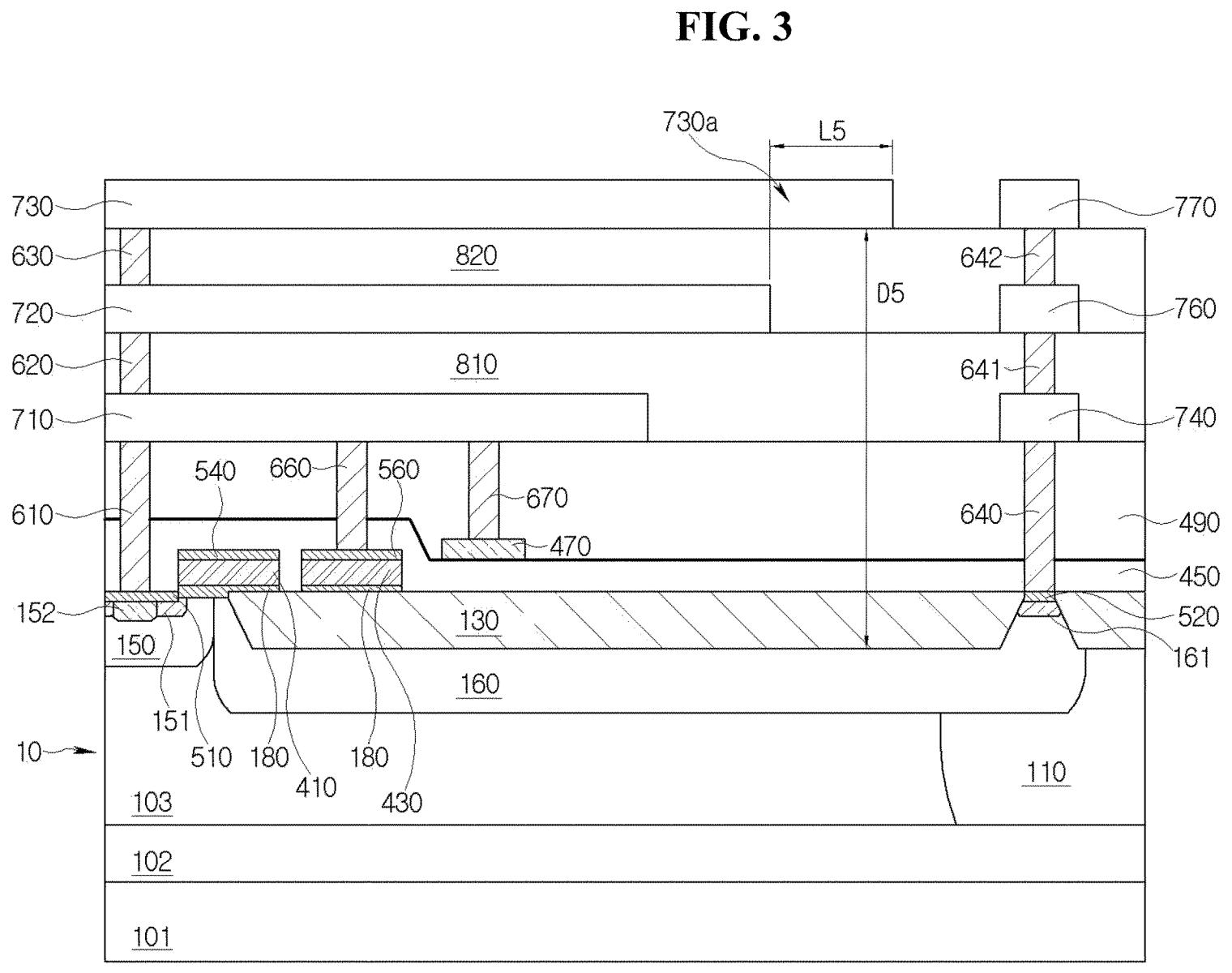

FIGS. 2 and 3 are cross-sectional views illustrating the semiconductor device according to another embodiment and still another embodiment of the present disclosure.

Referring to FIG. 2, the semiconductor device may further include a third interlayer insulating layer 810 and a second source metal wiring 720. In addition, the semiconductor device may further include a third drain metal wiring 760.

The third interlayer insulating layer 810 may be formed on the first source metal wiring 710, the first drain metal wiring 740, and the second interlayer insulating layer 490, while surrounding the first source metal wiring 710 and the first drain metal wiring 740.

The third interlayer insulating layer 810 may be an inter metal dielectric (IMD). The third interlayer insulating layer 810 may comprise silicon oxide (SiO2) film, or a material such as USG, TEOS, BPSG, PSG, and the like. The third interlayer insulating layer 810 may prevent a short circuit between the first source metal wiring 710 and the second source metal wiring 720. In addition, the third interlayer insulating layer 810 may prevent a short circuit between the first drain metal wiring 740 and the third drain metal wiring 760.

The second source metal wiring 720 may be formed on the third interlayer insulating layer 810. The second source metal wiring 720 may include a portion 720a that is formed longer than the first source metal wiring 710 by a fourth length L4 in the direction of the first drain region 161. The second source metal wiring 720 may be connected to a first via 620. In addition, the third drain metal wiring 760 may be formed on the third interlayer insulating layer 810. The third drain metal wiring 760 may be connected to a second via 641.

Here, the second source metal wiring 720 may be formed longer than a side surface of the first source metal wiring 710 in the direction of the first drain region 161 by the fourth length L4. The third interlayer insulating layer 810, the second interlayer insulating layer 490, the first interlayer insulating layer 450, and the field insulating layer 130 positioned below the elongated portion 720a of the second source metal wiring 720 may insulate between the elongated portion of the second source metal wiring 720 and the first drift region 160. Thus, the elongated portion of the second source metal wiring 720 serves as the first source metal wiring 710 and may be disposed to reduce the peak electric field formed in the first drift region 160 near the first drain region 161. Here, the elongated portion 720a of the second source metal wiring 720 and the first drift region 160 are spaced apart by the fourth depth D4.

Referring to FIG. 3, the semiconductor device may further include a fourth interlayer insulating layer 820 and a third source metal wiring 730. In addition, the semiconductor device may further include a fourth drain metal wiring 770. The third source metal wiring 730 may include a portion 730a formed longer than the second source metal wiring 720 in the direction of the first drain region 161 by a fifth length L5. The elongated portion 730a of the third source metal wiring 730 is spaced apart from the first drift region 160 by the fifth depth D5. The fourth interlayer insulating layer 820, the fourth drain metal wiring 770, and the third source metal wiring 730 may have the same structure and function as those of the third interlayer insulating layer 810, the third drain metal wiring 760, and the second source metal wiring 720 as described above with reference to FIG. 2, so the description thereof is omitted.

Figure 4:
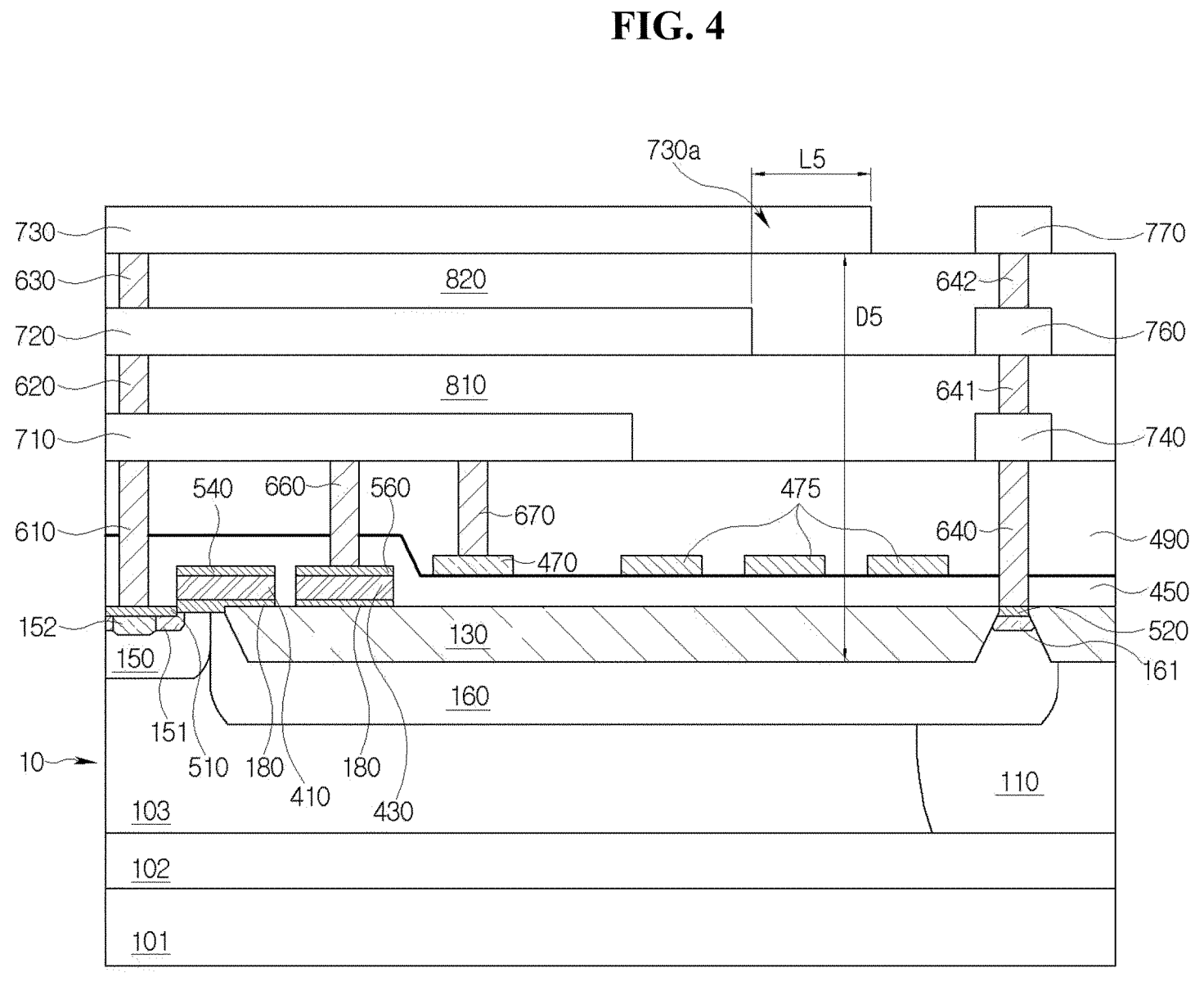

FIG. 4 is a cross-sectional view illustrating the semiconductor device according to further still another embodiment of the present disclosure.

Referring to FIG. 4, the semiconductor device may further include a plurality of dummy or floating field plate structure 475 formed side by side with the second field plate structure 470. The plurality of dummy or floating field plate structure 475 is disposed between the second field plate structure 470 and the drain region 161 to make uniform an electric field between the drain region 161 and the first field plate structure 430, thereby enhancing the breakdown voltage of the semiconductor device. The plurality of dummy or floating field plate structure 475 may be electrically connected to the second field plate structure 470, the source region 151, the drain region 161, or the gate structure 410 as needed. Alternatively, the plurality of dummy or floating field plate structure 475 may be formed in a floating state without being connected to the second field plate structure 470, the source region 151, the drain region 161 or the gate structure 410. The plurality of the dummy or floating field plate structures 475 may be formed for a uniform electric field.

FIG. 5 is a cross-sectional view illustrating the structure of two adjacent semiconductor devices according to the embodiment of the present disclosure.

Referring to FIG. 5, the two adjacent semiconductor devices may be symmetric with respect to a body region 150 or a pick-up region 152. The first drain region 161 may be symmetrically positioned to the second drain region 171 with respect to the body region 150 or the pick-up region 152.

The second gate structure 420 is symmetrical with the first gate structure 410 and may be formed between the body region 150 and the second drain region 171. The third field plate structure 440 is symmetrical with the first field plate structure 430 and may be formed between the second gate structure 420 and the second drain region 171.

The first interlayer insulating layer 450 may be formed on the substrate 10 to surround the first gate structure 410, the second gate structure 420, the first field plate structure 430, and the third field plate structure 440.

The fourth field plate structure 480 may be symmetrical with the second field plate structure 470 and may be formed on the first layer insulating layer 450 between the third field plate structure 440 and the second drain region 171. In addition, the position of the fourth field plate structure 480 may depend on the thickness of the first interlayer insulating layer 450.

The second interlayer insulating layer 490 may be formed on the first layer insulating layer 450 to surround the second field plate structure 470 and the fourth field plate structure 480. The third field plate contact plug 680 is symmetrical with the first field plate contact plug 660 and may be connected to the third field plate structure 440. The fourth field plate contact plug 690 is symmetrical with the second field plate contact plug 670 and may be connected to the fourth field plate structure 480. The second drain contact plug 650 is symmetrical with the first drain contact plug 640 and may be connected to the second drain region 171.

The first source metal wiring 710 may be formed on the second interlayer insulating layer 490 and may be connected to the source contact plug 610, the first field plate contact plug 660, the second field plate contact plug 670, the third field plate contact plug 680 and the fourth field plate contact plug 690.

Hereinafter, a method of manufacturing the semiconductor device according to an embodiment of the present disclosure described above will be explained.

FIGS. 6 to 19 are cross-sectional views illustrating a series of processes of a method of manufacturing a semiconductor device according to an embodiment of the present disclosure.

Figure 6:
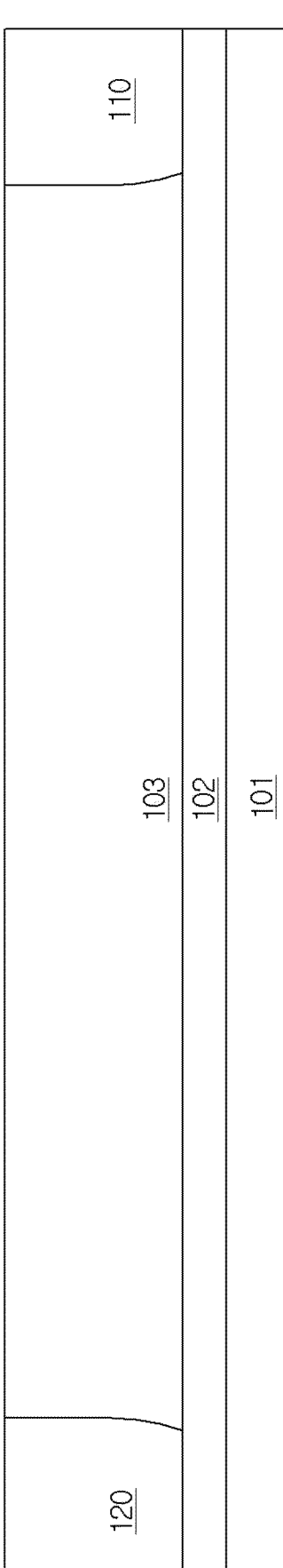
FIGS. 6 to 19 are cross-sectional views illustrating a series of processes of a method of manufacturing a semiconductor device according to an embodiment of the present disclosure.

Referring to FIG. 6, the first semiconductor layer 101 having the first conductivity type may be formed on the substrate 10. The first semiconductor layer 101 may be formed by doping P-type impurities.

The second semiconductor layer 102 having the second conductivity type may be formed on the first semiconductor layer 101. The second semiconductor layer 102 may be referred to as an NBL (N+ Buried Layer). The second semiconductor layer 102 may be formed by doping N-type impurities.

The third semiconductor layer 103 having the first conductivity type may be formed on the second semiconductor layer 102. The third semiconductor layer 103 may be referred to as an epi-layer. The third semiconductor layer 103 may be formed by doping P-type impurities.

The first deep well region 110 and the second deep well region 120, disposed under the first drain region 161 and may have the second conductivity type, may be formed under the first drift region 160. The first deep well region 110 and the second deep well region 120 may be configured as High Voltage N Wells (HVNW). The first deep well region 110 and the second deep well region 120 may be formed by ion-implanting N-type impurities into the third semiconductor layer 103. Also, the first deep well region 110 and the second deep well region 120 may be formed in contact with the second semiconductor layer 102 while ion-implanted N-type impurities are diffused.

Figure 7:
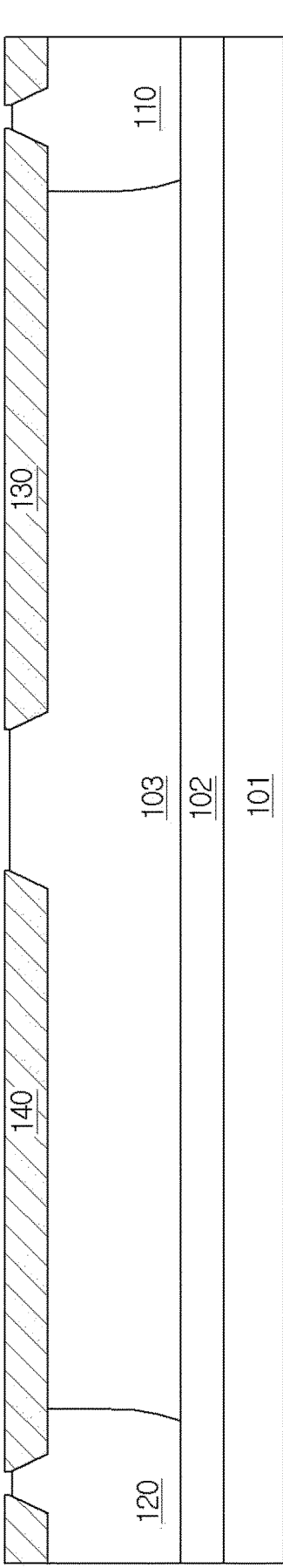

Referring to FIG. 7, the field insulating layers 130 and 140 may be formed on the third semiconductor layer 103, the first deep well region 110, and the second deep well region 120 through a shallow trench process, such that the source region and the drain region may be formed to be spaced apart from each other. Alternatively, the field insulating layers 130 and 140 may be formed through a deep trench or LOCOS process. Also, the field insulating layers 130 and 140 may comprise an oxide layer or a nitride layer.

Figure 8:
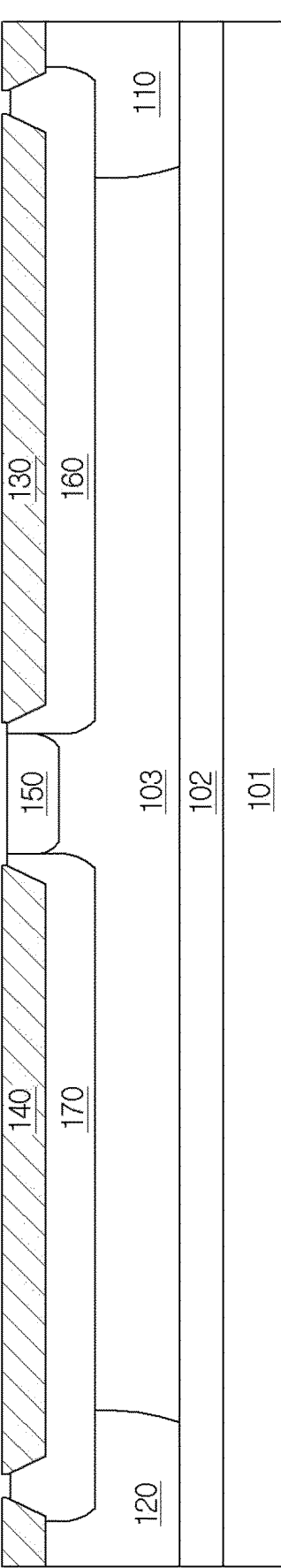

Referring to FIG. 8, the body region 150 may be formed by implanting P-type impurities into a portion of a region of an exposed third semiconductor layer 103. Then, the first deep well region 110, the second deep well region 120, the first drift region 160, and the second drift region 170 may be formed by implanting N-type impurities into exposed portions of the third semiconductor layer 103.

Figure 9:
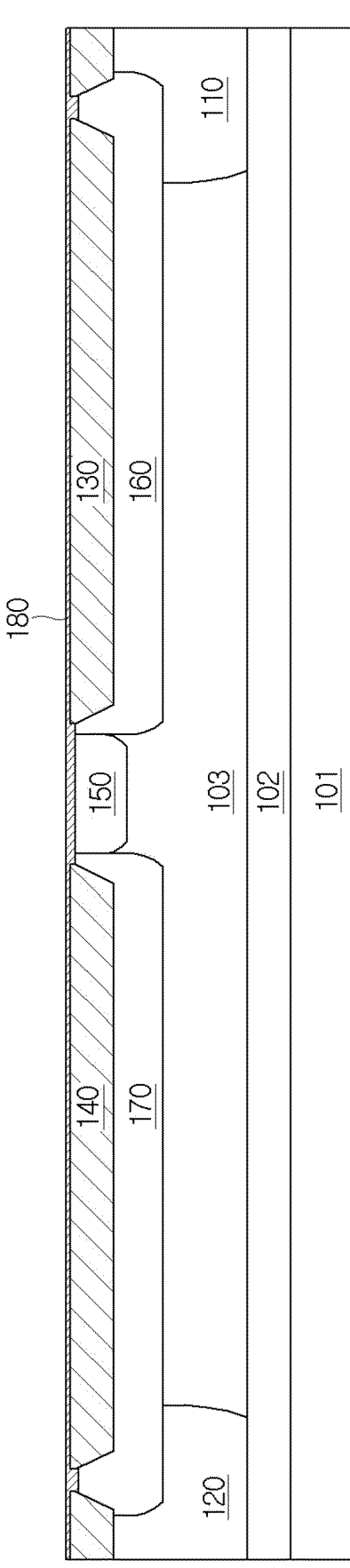

Referring to FIG. 9, the gate insulating layer 180 may be formed by depositing an insulating layer on the substrate 10. The gate insulating layer 180 may comprise any one or a plurality of layers of SiO2, SiN, SiON, or a high-k material.

The gate insulating layer 180 may be grown by a thermal oxidation process. In addition, the gate insulating layer 180 may be also deposited by a CVD process.

Figure 10:
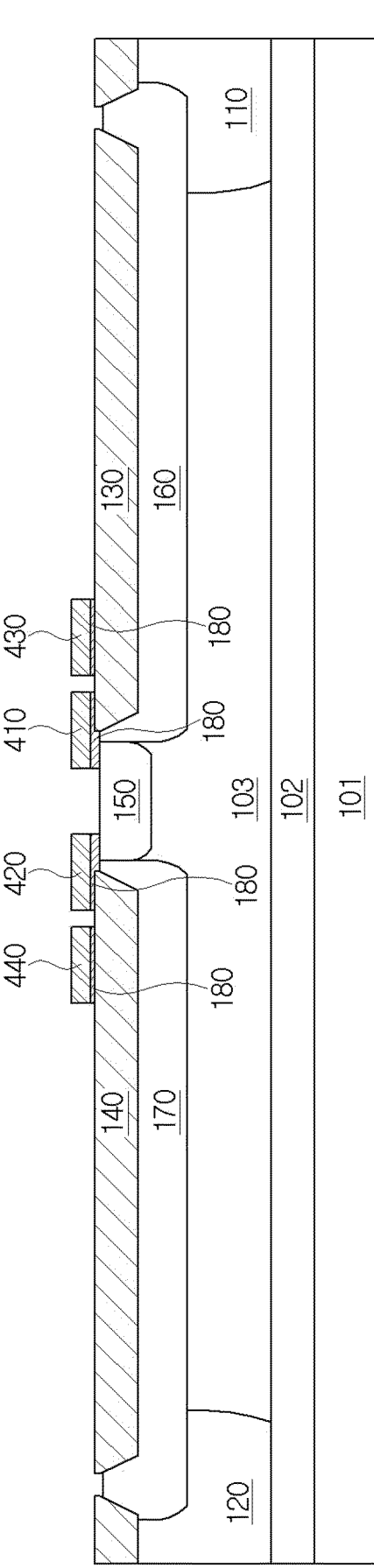

Referring to FIG. 10, the first gate structure 410, the second gate structure 420, the first field plate structure 430 and the third field plate structure 440 may be formed by depositing poly-silicon (Poly-Si) or a metal film on the gate insulating layer 180, and then performing a photo process or an etching process. Here, WN, TiN, GaN, W, Ti, Cu, Al, and the like may be used as a metal film.

Figure 11:
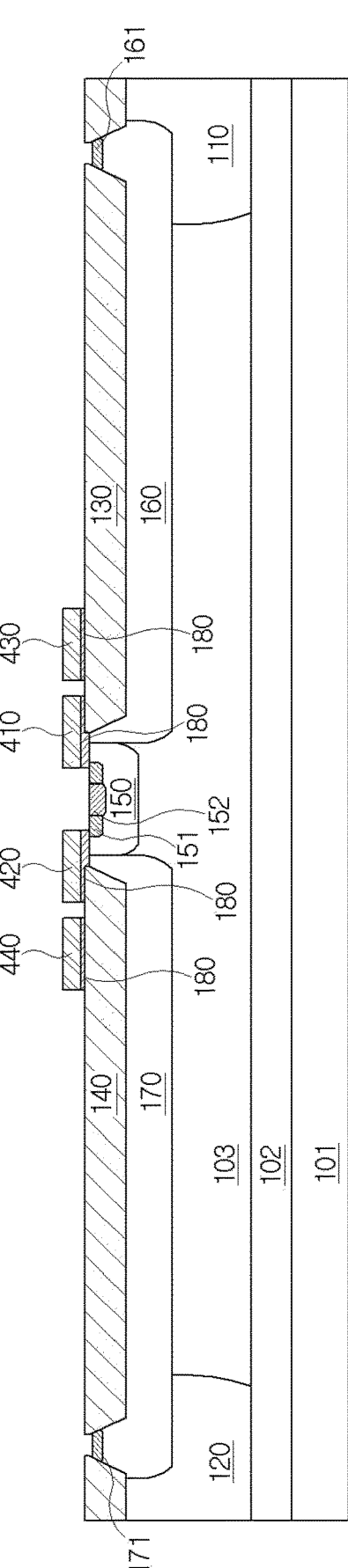

Referring to FIG. 11, the source region 151 and the pickup region 152 may be formed in the body region 150. Herein, the pickup region 152 having the P-type conductivity type, which is of the first conductivity type, may be formed by doping P-type impurities into the body region 150. In addition, the first drain region 161 may be formed in the first drift region 160, and the second drain region 171 may be formed in the second drift region 170.

Figure 12:
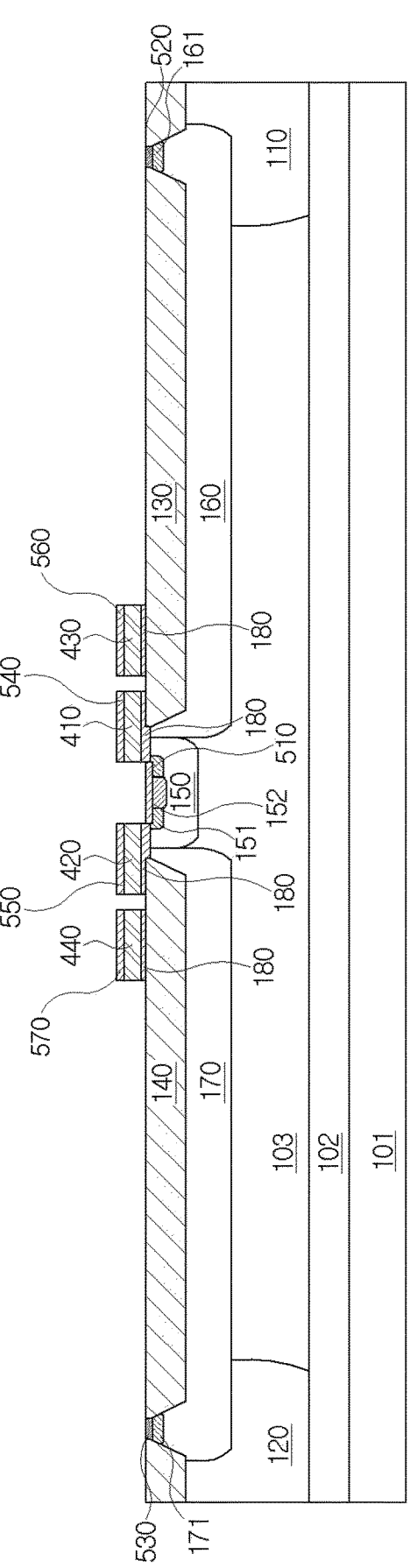

Referring to FIG. 12, the source silicide 510, the first gate silicide 540, the second gate silicide 550, the first field plate silicide 560, the third field plate silicide 570, the first drain silicide 520, and the second drain silicide 530 may be formed by a salicide process.

Figure 13:
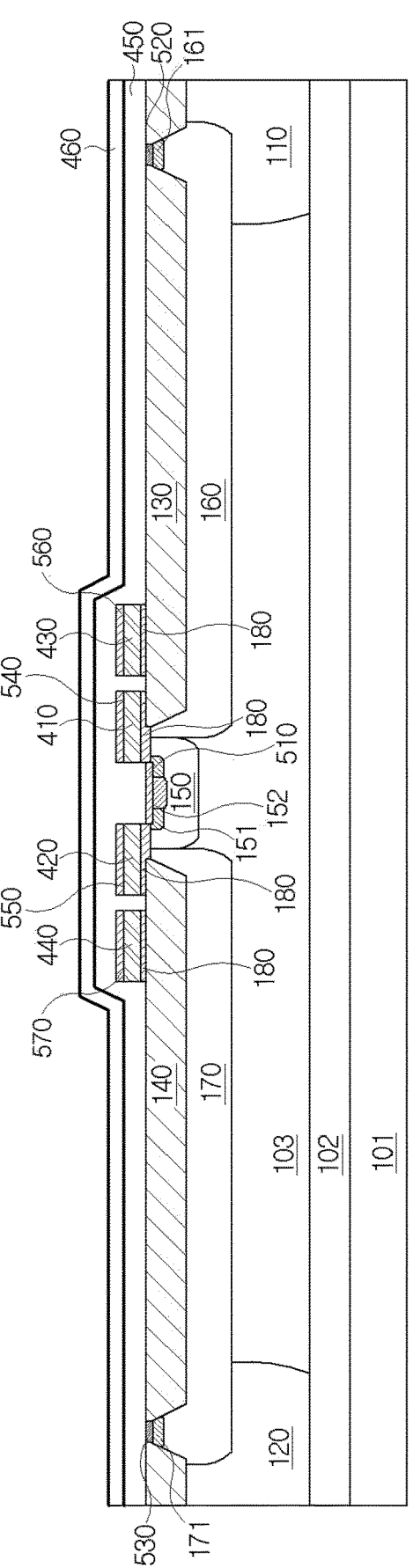

Referring to FIG. 13, the first interlayer insulating layer 450 may be deposited after the salicide process. Subsequently, a field plate metal film or metal nitride film 460 used for the second and fourth field plate structures 480 may be sequentially deposited and formed. Examples of the field plate metal film include titanium (Ti), tungsten (W), tantalum (Ta), aluminum (Al), nickel (Ni), and copper (Cu). Examples of the field plate metal nitride film include titanium nitride (TiN), tungsten nitride (WN), tantalum nitride (TaN), and the like. The second field plate structure 470 may be typically made of titanium nitride (TiN), which is easy to dry etch.

The first interlayer insulating layer 450 may be an inter level dielectric (ILD). The first interlayer insulating layer 450 may comprise silicon oxide (SiO2) or a material such as USG, TEOS, BPSG, or PSG.

Figure 14:
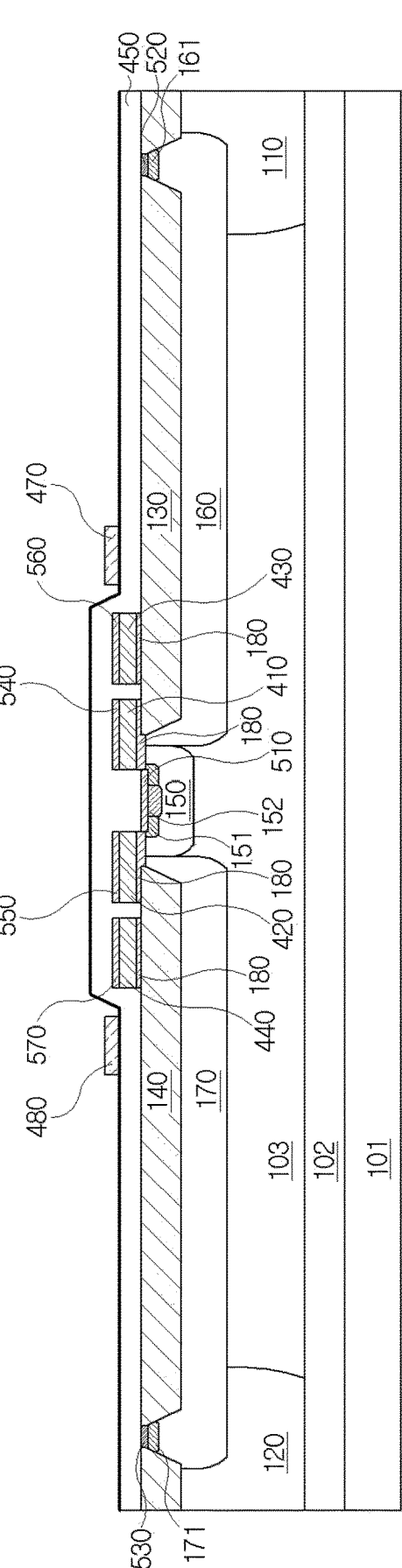

Referring to FIG. 14, a process of forming the second and fourth field plate structures 470 and 480 may be performed. For example, the second and fourth field plate structures 470 and 480 may be formed by performing a patterning process for the metal nitride film 460, using a photo process, a dry etching process, or the like.

Figure 15A:
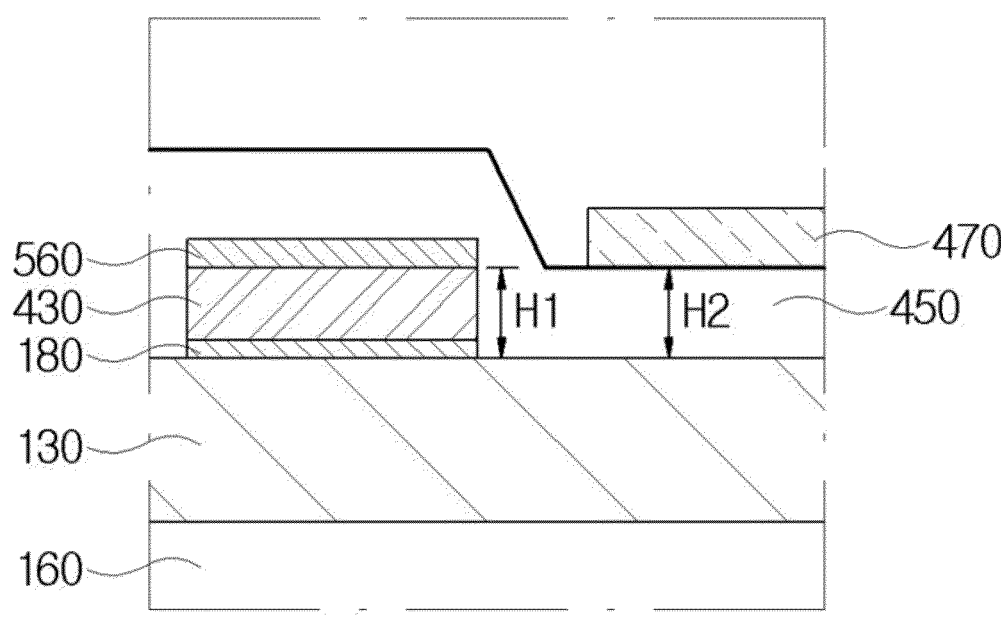
Figure 15B:
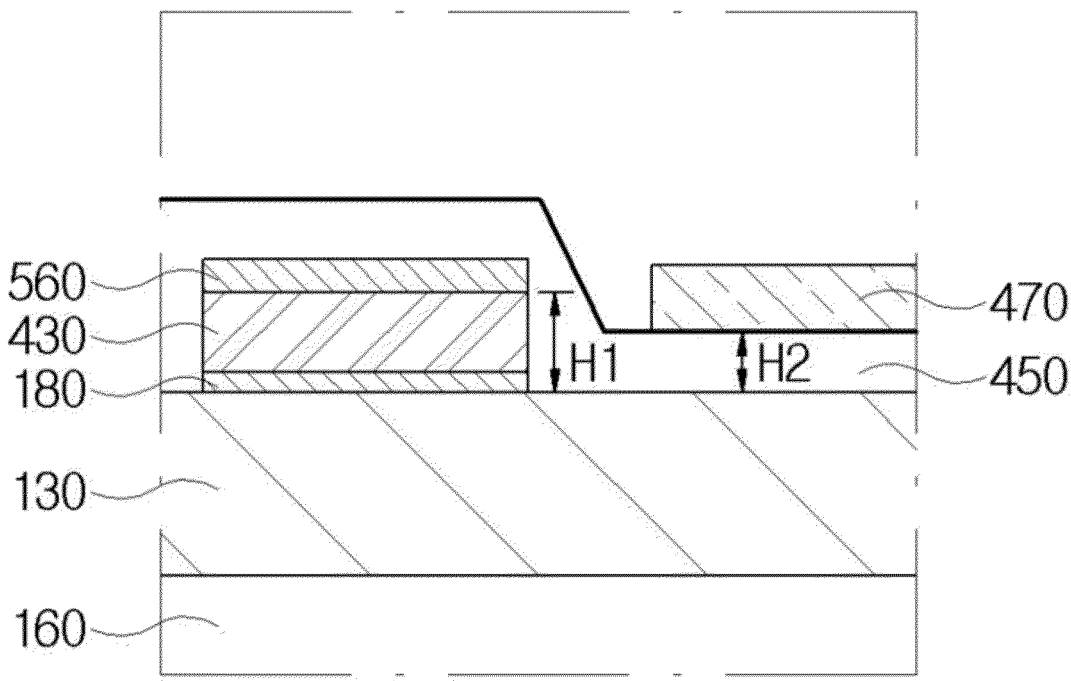
Figure 15C:
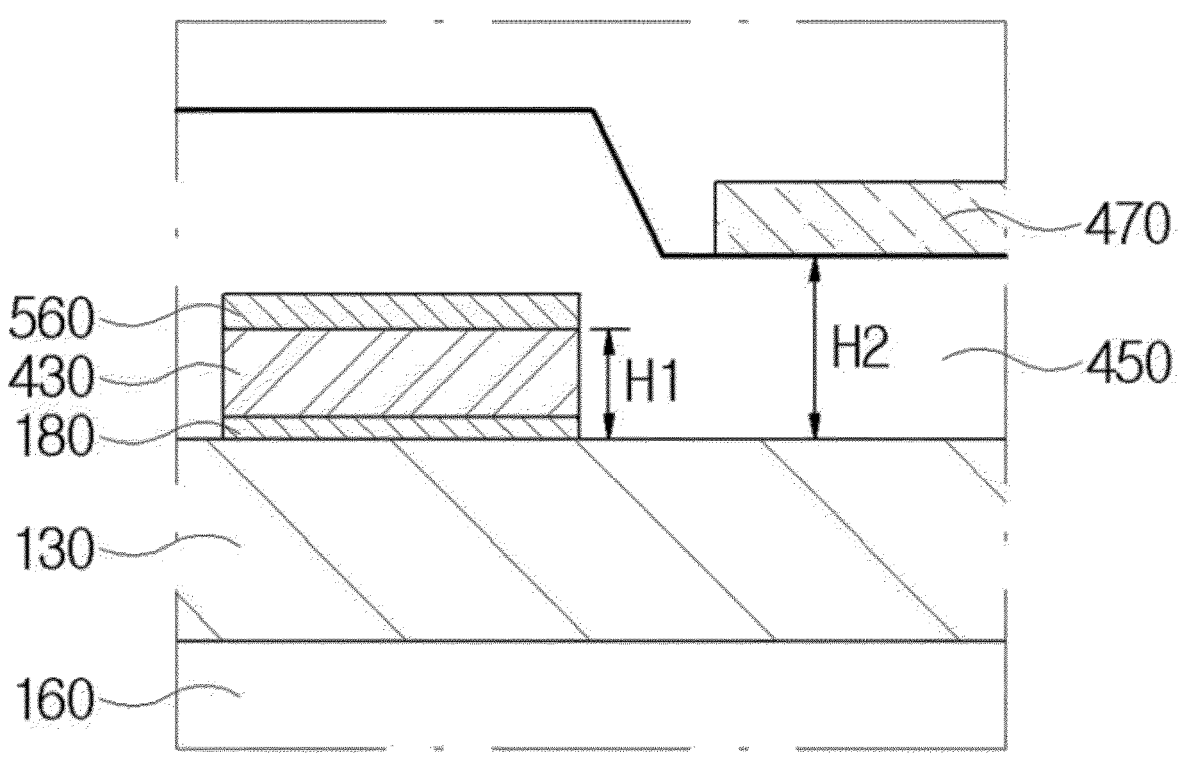

FIGS. 15A to 15C are views for explaining that the position of the second field plate structure 470 may vary depending on the thickness of the first interlayer insulating layer 450.

Referring to FIG. 15A, a first height H1 of the first field plate structure 430 may be equal to a second height H2 of the first interlayer insulating layer 450. Thus, the second field plate structure 470 may be located slightly above the first field plate structure 430 with respect to a top surface of the substrate 10.

Referring to FIG. 15B, the first height H1 of the first field plate structure 430 may be greater than the second height H2 of the first interlayer insulating layer 450. Thus the second field plate structure 470 may be overlapped laterally with the first field plate structure 430.

Referring to FIG. 15C, the first height H1 of the first field plate structure 430 may be lower than the second height H2 of the first interlayer insulating layer 450. Thus the second field plate structure 470 may be located greatly above the first field plate structure 430 with respect to the top surface of the substrate 10.

Referring to FIGS. 15A and 15C, the relative positions of the first and the second field plate structures 430 and 470 may depend on the thickness of the first interlayer insulating layer 450.

Figure 16:
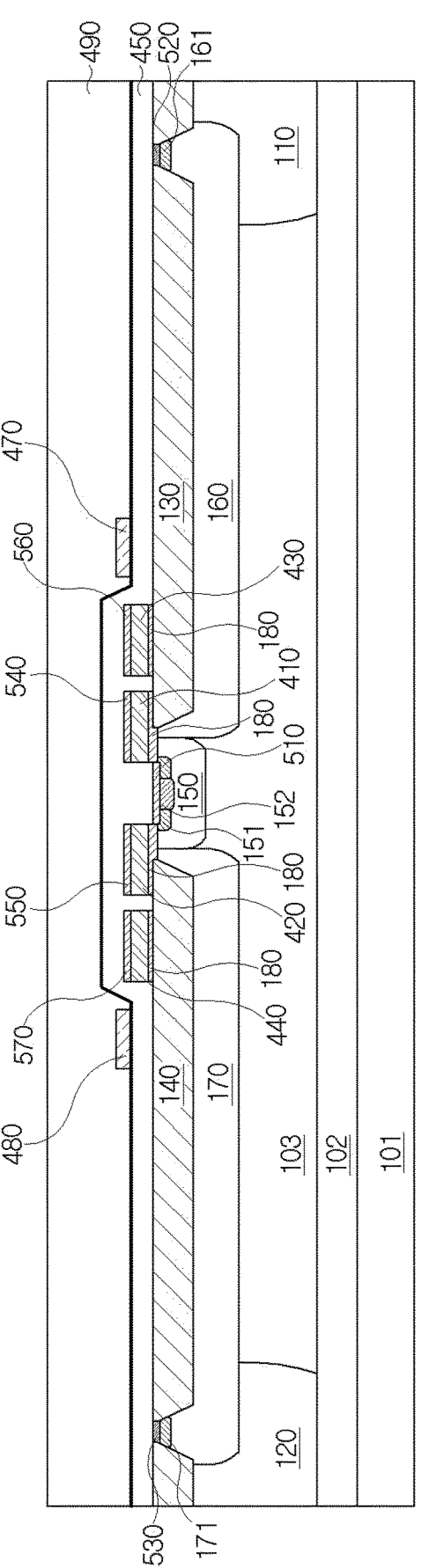

Referring to FIG. 16, the second interlayer insulating layer 490 may be formed on the first interlayer insulating layer 450 to surround the second and fourth field plate structures 470 and 480.

The second interlayer insulating layer 490 may be an inter level dielectric (ILD). The second interlayer insulating layer 490 may comprise silicon oxide (SiO2) or a material such as USG, TEOS, BPSG, or PSG.

Figure 17:
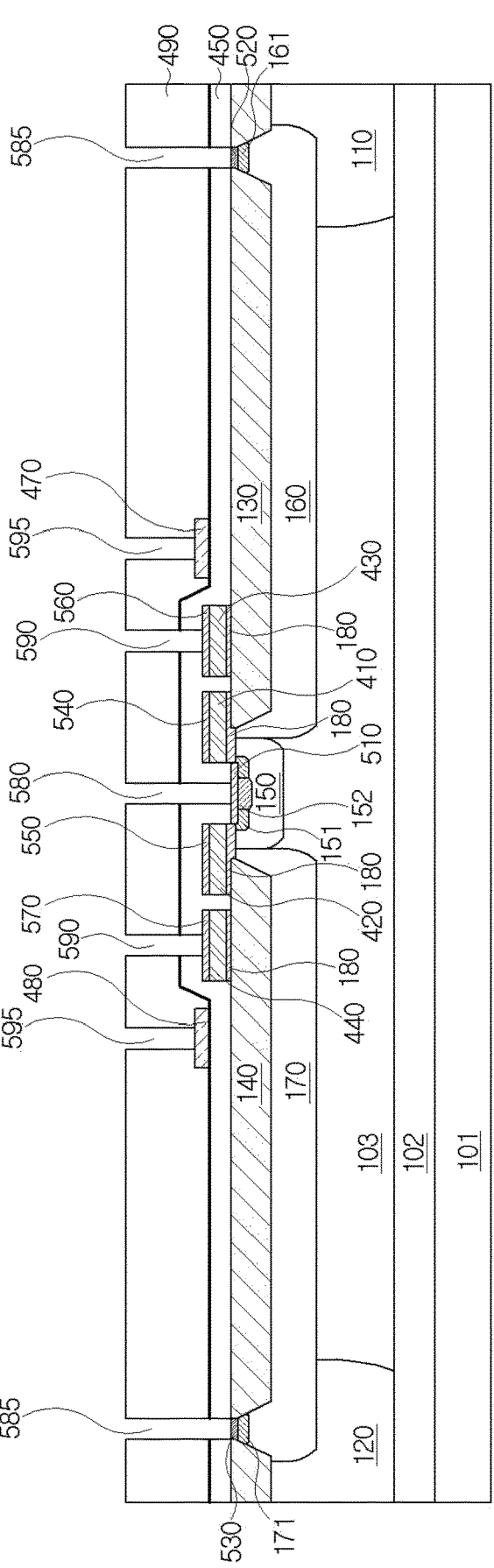

Referring to FIG. 17, through a photo process, an etching process, or the like, contact holes 580, 585, 590, and 595 may be formed while passing through the first interlayer insulating layer 450 and the second interlayer insulating layer 490 and exposing upper portions of the body region 150, the source region 151, and the pickup region 152, the first and second drain regions 161 and 171, the first and second gate structures 410 and 420, and the first to fourth field plate structures 430, 440, 470, and 480, respectively. Here, the plurality of contact holes 580, 585, 590, and 595 may be formed to simultaneously pass through the first interlayer insulating layer 450 and the second interlayer insulating layer 490. Accordingly, the process of manufacturing the semiconductor device may be simplified.

The plurality of contact holes 580, 585, 590, and 595 may have different depths or vertical lengths. For example, depths of the contact holes 580 and 585 exposing the source region 151, the pickup region 152, and the first and second drain regions 161 and 171 may be formed deeper than depths of the contact holes 590 exposing the first and third field plate structures 430 and 440. In addition, the depths of the contact holes 590 exposing the first and third field plate structures 430 and 440 may be formed deeper than the depths of contact holes 595 exposing the second and fourth field plate structures 470 and 480.

Figure 18:
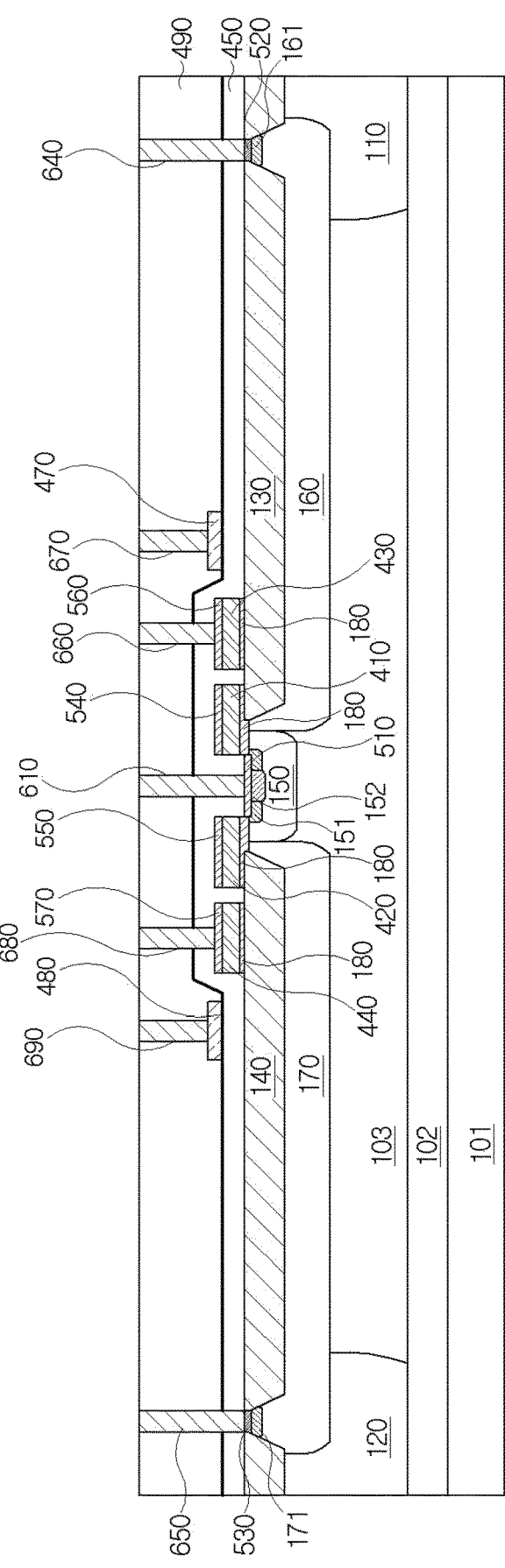

Referring to FIG. 18, the source contact plug 610, the first and second drain contact plugs 640 and 650, the first and second contact plugs (not illustrated), and the first to fourth field plate contact plugs 660, 670, 680, and 690 may be formed, by gap-filling inside the contact holes with a metal material such as tungsten. Here, the plurality of contact plugs 610, 640, 650, 660, 670, 680, and 690 may be simultaneously formed on the first interlayer insulating layer 450 and the second interlayer insulating layer 490. Accordingly, the process of manufacturing the semiconductor device may be simplified.

The plurality of contact plugs 610, 640, 650, 660, 670, 680, and 690 may have different depths or vertical lengths. For example, the depths of the source contact plug 610 and the first and second drain contact plugs 640 and 650 may be formed deeper than those of the first to fourth field plate contact plugs 660, 670, 680 and 690. Also, the depths of the first and third field plate contact plugs 660 and 680 may be formed deeper than those of the second and fourth field plate contact plugs 670 and 690.

Figure 19:
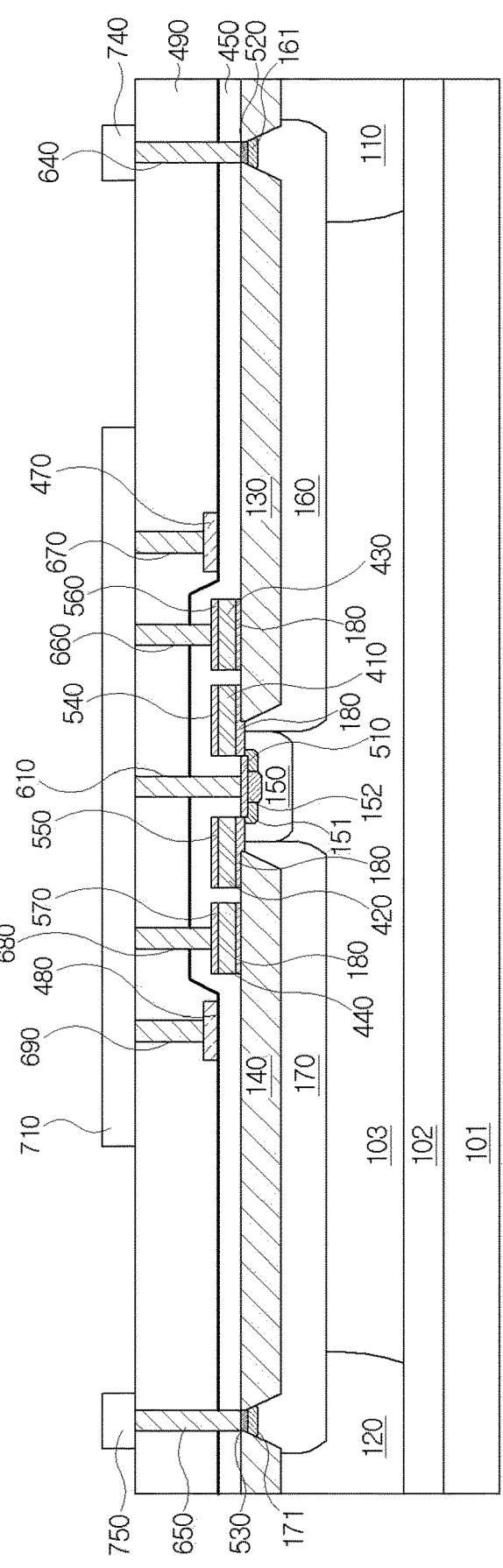

Referring to FIG. 19, the first source metal wiring 710 and the first and second drain metal wirings 740 and 750 may be formed on the second interlayer insulating layer 490. The first source metal wiring 710 may be connected to the source contact plug 610 and the first to fourth field plate contact plugs 660, 670, 680, and 690. The first and second drain metal wirings 740 and 750 may be connected to the first and second drain contact plugs 640 and 650, respectively.

The structure of the semiconductor device and the method of manufacturing the same described above may relieve the electric field formed high in the drain region of LDMOS and form a high breakdown voltage. In addition, by adjusting the heights step by step to form a plurality of field plate structures and metal wirings, the efficiency may be increased, the difficulty in the process may be lowered, and price increase may be prevented. In addition, by providing the bipolar-CMOS-DMOS (BCD) process optimized for the semiconductor devices having fast switching speed, a chip size of a power management product using the BCD process may be reduced and the efficiency of a power block may be improved.

According to various embodiments of the present disclosure, high performance LDMOS transistors with low on-resistance and high breakdown voltage may be formed.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, in addition to the above and all drawing disclosures, the scope of the disclosure is also inclusive of the claims and their equivalents, i.e., all variations within the scope of the claims and their equivalents are to be construed as being included in the disclosure.

What is claimed is:

1. A semiconductor device, comprising:
   a source region and a drain region formed to be spaced apart from each other on a substrate;
   a gate structure formed between the source region and the drain region on the substrate;
   a field insulating layer formed between the gate structure and the drain region;
   a first field plate structure disposed on the field insulating layer, on a same plane as the gate structure, and formed of a same material as the gate structure;
   a first interlayer insulating layer formed on the first field plate structure;
   a second field plate structure disposed on the first interlayer insulating layer, between the first field plate structure and the drain region, and comprising a material different from the material of the first field plate structure;
   a first source metal wiring connected to the source region, the first field plate structure, and the second field plate structure; and
   a drain metal wiring connected to the drain region.

2. The semiconductor device of claim 1, further comprising:
   a source silicide formed on the source region;
   a gate silicide formed on the gate structure;
   a first field plate silicide formed on the first field plate structure; and
   a drain silicide formed on the drain region.

3. The semiconductor device of claim 1, further comprising:
   a source contact plug connected to the source region;
   a first field plate contact plug connected to the first field plate structure;

a second field plate contact plug connected to the second field plate structure; and
   a drain contact plug connected to the drain region,
   wherein a vertical length of the second field plate contact plug is smaller than a vertical length of the first field plate contact plug.

4. The semiconductor device of claim 3,
   wherein the first source metal wiring is connected to the source contact plug, the first field plate contact plug, and the second field plate contact plug, and
   wherein the drain metal wiring is connected to the drain contact plug.

5. The semiconductor device of claim 1, further comprising:
   a second source metal wiring connected to the first source metal wiring,
   wherein a longitudinal length of the second source metal wiring is longer than a longitudinal length of the first source metal wiring.

6. The semiconductor device of claim 1, further comprising:
   a second interlayer insulating layer formed on the first interlayer insulating layer.

7. The semiconductor device of claim 6, further comprising:
   a body region having a first conductivity type, formed on the substrate to surround the source region, and spaced apart from the field insulating layer; and
   a drift region having a second conductivity type and formed to surround the drain region and the field insulating layer,
   wherein the field insulating layer is disposed between the first field plate structure and the drift region,
   wherein the field insulating layer and the first interlayer insulating layer are disposed between the second field plate structure and the drift region, and
   wherein the field insulating layer, the first interlayer insulating layer, and the second interlayer insulating layer are disposed between the first source metal wiring and the drift region.

8. The semiconductor device of claim 1,
   wherein the first field plate structure and the second field plate structure are formed on different planes,
   wherein the gate structure and the first field plate structure comprise poly-silicon, and
   wherein the second field plate structure comprises a metal nitride film.

9. A semiconductor device, comprising:
   a first drift region of a first conductivity type disposed on a semiconductor layer and a first deep well region of a second conductivity type;
   a field insulating layer disposed on the first drift region;
   a body region disposed adjacent of the first drift region and spaced apart from the field insulating layer;
   a source region disposed in the body region;
   a drain region disposed above the first deep well region in the first drift region;
   a gate structure disposed on portions of the field insulating layer, the first drift region, the body region, and the source region;
   a first field plate structure disposed on the field insulating layer, on a same plane as the gate structure, and formed of a same material as a material of the gate structure;
   a first interlayer insulating layer disposed on the field insulating layer, the gate structure, and the first field plate structure;

a second field plate structure disposed on the first inter-layer insulating layer between the first field plate structure and the drain region, and formed of a material different from a material of the first field plate structure;

a first source metal wiring connected to the source region, the first field plate structure, and the second field plate structure; and a drain metal wiring connected to the drain region.

10. The semiconductor device of claim 9, further comprising:

a pickup region disposed adjacent the source region;

a source silicide disposed on the pickup region and the source region;

a gate silicide disposed on the gate structure;

a first field plate silicide disposed on the first field plate structure; and a drain silicide disposed on the drain region.

11. The semiconductor device of claim 10, further comprising:

a source contact plug connected to the source region and the first source metal wiring;

a first field plate contact plug connected to the first field plate structure and the first source metal wiring; and a second field plate contact plug connected to the second field plate structure and the first source metal wiring, wherein a vertical length of the second field plate contact plug is smaller than a vertical length of the first field plate contact plug.

12. The semiconductor device of claim 9, further comprising:

a second source metal wiring connected to the first source metal wiring, wherein a longitudinal length of the second source metal wiring is formed longer than a longitudinal length of the first source metal wiring.

13. The semiconductor device of claim 9, further comprising:

a second interlayer insulating layer disposed on the first interlayer insulating layer.

14. The semiconductor device of claim 9, wherein the first field plate structure and the second field plate structure are disposed on different planes, wherein the gate structure and the first field plate structure comprise poly-silicon, and wherein the second field plate structure comprises a metal nitride film.

* * * * *